United States Patent
Bollinger et al.

(10) Patent No.: US 6,762,136 B1
(45) Date of Patent: Jul. 13, 2004

(54) METHOD FOR RAPID THERMAL PROCESSING OF SUBSTRATES

(75) Inventors: Lynn David Bollinger, Ridgefield, CT (US); Iskander Tokmouline, New Fairfield, CT (US)

(73) Assignee: Jetek, Inc., Ridgefield, CT (US)

(*) Notice: Subject to any disclaimer, the term of this patent is extended or adjusted under 35 U.S.C. 154(b) by 531 days.

(21) Appl. No.: 09/693,117

(22) Filed: Oct. 20, 2000

Related U.S. Application Data

(63) Continuation of application No. PCT/US00/27113, filed on Sep. 28, 2000.
(60) Provisional application No. 60/162,762, filed on Nov. 1, 1999.

(51) Int. Cl.$^7$ .............................................. H01L 21/477
(52) U.S. Cl. ........................ 438/795; 438/730; 216/67; 250/492.2
(58) Field of Search ................................ 438/795, 710, 438/715, 716, 729, 730; 216/59, 67; 250/492.2

(56) References Cited

U.S. PATENT DOCUMENTS

| | | | |
|---|---|---|---|
| 4,783,695 A | | 11/1988 | Eichelberger et al. ......... 357/65 |
| 5,122,043 A | | 6/1992 | Matthews ..................... 425/77 |
| 5,153,430 A | * | 10/1992 | Gammel et al. |
| 5,302,547 A | | 4/1994 | Wojnarowski et al. ...... 437/173 |
| 5,314,709 A | | 5/1994 | Doany et al. ................. 427/96 |
| 5,336,641 A | | 8/1994 | Fair et al. .................... 437/248 |
| 5,342,660 A | | 8/1994 | Cann et al. .................. 427/577 |
| 5,554,257 A | * | 9/1996 | Yokogawa et al. .......... 438/730 |
| 5,645,645 A | * | 7/1997 | Zhang et al. |
| 5,700,420 A | * | 12/1997 | Nakagawa et al. |
| 5,716,500 A | * | 2/1998 | Bardos et al. |
| 5,719,068 A | * | 2/1998 | Suzawa et al. |
| 5,811,021 A | | 9/1998 | Zarowin et al. ............. 216/67 |
| 5,830,376 A | | 11/1998 | Bohlke et al. ............... 216/65 |
| 5,843,239 A | | 12/1998 | Shrotriya ..................... 134/1.1 |
| 5,913,127 A | | 6/1999 | Dennison et al. ............ 438/398 |
| 5,967,156 A | | 10/1999 | Rose et al. ................... 134/7 |
| 5,968,283 A | | 10/1999 | Walraven et al. ............ 134/19 |
| 6,090,207 A | | 7/2000 | Knauss et al. ............... 118/715 |

(List continued on next page.)

OTHER PUBLICATIONS

PCT International Search Report mailed on Nov. 28, 2000 for copending International Patent Application PCT/US00/27113.

Alexander E. Braun's article entitled, "Thermal Processing Options Focus and Specialize" May, 1999; pp. 56–64 of Semiconductor International.

*Primary Examiner*—M. Wilczewski
(74) *Attorney, Agent, or Firm*—St. Onge Steward Johnston & Reens LLC

(57) ABSTRACT

A technique is described for a very rapid thermal treatment of a substrate used to make semiconductor devices. The substrate is subjected to a very hot gas stream such as can be produced from an arc-type plasma generator. The substrate is then moved through the hot gas stream at a velocity selected to sufficiently heat the surface of the substrate to a high temperature at which doping and diffusion processes can be done in an efficient manner, while a thermal gradient is preserved throughout the thickness of the substrate. In this manner as the substrate moves through the hot gas stream a rapid heating of the surface is achieved and as the heated portion moves out of the gas stream, the bulk of the substrate can assist in the cooling of the heated portion. Sharply defined doping regions can be formed in the substrate. The method yields temperature heating and cooling rates of the order of $10^{5°}$ C./sec, peak temperatures up to the melting point of a substrate such as silicon without permanent distortion or introducing defects into the substrate, enables very fast low temperature annealing and activation with peak temperatures of 3000 to 100° C., provides process uniformity and throughput needs for silicon device manufacturing.

22 Claims, 11 Drawing Sheets

U.S. PATENT DOCUMENTS

| | | | |
|---|---|---|---|
| 6,121,061 A | 9/2000 | Van Bilsen et al. | 438/14 |
| 6,139,678 A | 10/2000 | Siniaguine | 156/345 |
| 6,149,988 A | 11/2000 | Shinohara et al. | 427/596 |
| 6,165,273 A | 12/2000 | Fayfield et al. | 118/722 |
| 6,218,640 B1 * | 4/2001 | Selitser | |
| 6,323,134 B1 * | 11/2001 | Siniaguine | |
| 6,492,613 B2 * | 12/2002 | Bollinger et al. | |

* cited by examiner

METHOD FOR RAPID THERMAL PROCESSING OF SUBSTRATES

PRIOR APPLICATIONS

Applicants claim priority based upon copending continuation International Patent Application PCT/US00/27113, entitled "Atmospheric Process And System For Controlled And Rapid Removal of Polymers From High Depth To Width Ratio Holes", bearing an international filing date of Sep. 28, 2000, published in English on Apr. 5, 2001 and designating the United States and further having been filed by the same inventors and assigned to the same assignee as of this patent application.

This patent application claims priority of the following United States Patent Applications bearing:

Serial No. 60/162,762 filed Nov. 1, 1999 for "Apparatus and Control Method To Provide Very Rapid Thermal Processing Of Semiconductor Wafers By High Heat Flux Gas Convective Heating Using An Atmospheric Plasma System," by Lynn David Bollinger and Iskander Tokmouline and assigned to the same assignee as for this invention; and Provisional Patent Application mailed July, 2000 to the U.S. Patent and trademark Office for "Method Of Rapid Thermal Processing Substrates Using Gas Heating To Obtain Very Rapid Heating And Cool-Down With Control Of The Temperature Profile Across The Substrate Thickness," and assigned to the same assignee as for this invention and bearing the Assignee's reference No. 2000-006; and United States Patent Application filed Oct. 12, 2000 by Lynn David Bollinger and Iskander Tokmouline and assigned to the same assignee as for this invention and entitled "Wafer Holder For Rotating And Translating Wafers".

All of said prior patent applications are incorporated herein by reference thereto.

FIELD OF THE INVENTION

This invention relates to semiconductor manufacturing generally and more specifically to thermal processing of substrates used to make semiconductor devices.

BACKGROUND OF THE INVENTION

In the fabrication of different types of advanced semiconductor devices very rapid thermal processing is becoming a critical need. Device applications include diffusion and annealing of implanted semiconductors to form high conductivity structures in substrates; annealing of a number of different materials used in CMOS logic devices and DRAM memory devices as well as processing specialty compound semiconductor devices. A general requirement for many such advanced devices is to very rapidly raise the temperature of the surface and then very rapidly cool-down the surface to enable a diffusion or anneal process without degrading other characteristics of the device materials.

Application of Shallow Junction and Channel Formation in Silicon Devices

There exists a manufacturing need to form very shallow, very high conductivity structures in silicon logic and memory devices with critical pattern dimensions of 0.13 microns and below. Critical shallow high conductivity structures are used in logic devices, source and drain connection junctions and in gate channels; and in silicon junctions for memory devices. Need for a production means to make shallow, highly conductive paths in the range of 40–20 nm depth are projected by 2003. Means to produce junction and channel depths of less than 10 nm are being investigated by many.

Thermal Budget Limitation on Shallow Junction and Channel Formation

To form high conductivity shallow paths in single crystal silicon, a thermal processing step is required. The two methods of driving the doping material into the single crystal silicon so that the doped crystal becomes highly conductive are: (1) implantation of the doping material into the silicon by accelerating the doping atoms into the silicon surface with sufficient energy, followed by a high temperature anneal to repair the crystal damage by the implant process; and (2) diffusion of the doping atoms into the silicon by having a high concentration of doping material on the silicon surface and raising the silicon temperature so that the doping material-diffuses into the silicon. The seed doping material may be in a layer deposited on the silicon surface or may be in the gas at the surface of the wafer.

If shallow high conductivity paths are to be formed there is a maximum allowable "thermal budget" for a given depth of the doping material responsible for the conductivity. Two factors that relate to obtaining very high conductivity shallow structures are: diffusion rates and concentration of the doping atoms in the silicon.

The diffusion rate of a doping material into silicon follows an exponential type dependence on temperature. For a high temperature requirement (e.g., 1200° C.), the doping atoms will rapidly diffuse into the silicon and in a short time a shallow highly conductive area can be obtained.

On the other hand, at a relatively low temperature for diffusion into silicon, (e.g., 900° C.), a long diffusion time is required that gives a concentration doping gradient that extends relatively deep into the silicon. At the same time other doped areas in the device will diffuse out from their respective initial doping areas.

Consequently, very shallow doping requires a short time duration high temperature pulse. Ideally, the pulse would be a spike that rapidly rises to, and falls from, a high temperature. Similarly, for annealing, crystal damage resulting from a shallow implantation of doping material, a short high temperature pulse is required to maintain a sharply defined, shallow conductive area having a steep concentration gradient at the conductive area boundary. To obtain a short high temperature pulse in the wafer, a means is needed for a well controlled, very rapid, high heat input to the wafer.

High electrical conductivity structures in silicon semiconductor devices are in a non-equilibrium concentration regime. The concentration of doping atoms in the silicon structure is greater than the solubility of the doping material at ambient, operating temperature. Diffusing-or annealing the doping atoms at a high temperature and then cooling the silicon rapidly enough to "freeze" the impurity doping atoms into a single crystal structure, achieves this. In this way the doping concentration is set by the solubility of the doping atoms in silicon at the peak process temperature. A higher concentration of doping atoms in a single crystal structure gives a higher electrical conductivity.

Current Methods Under Investigation for Shallow Junction and Channel Formation

Ion implantation and anneal:

A high current, low energy ion implanter implants doping atoms to the required depth and concentration followed by a rapid thermal anneal of the damage. Two rapid anneal methods now used are radiant Rapid Thermal Processing (RTP) and fast furnace anneal RTP. Radiant RTP systems are reported to obtain a temperature rise rate of up to 300°

C./sec, but significantly slower cool time, see the following paragraph and also FIG. 6. Issues with this approach for future device generations requiring shallow implants and diffusion are:

Ion implanters have high capital cost

Limitations to current production Radiant RTP, see following paragraph

Radiant RTP:

Heat lamps rapidly heat the silicon wafer. Cooling is by contact with a cooled wafer holding plate. Radiant energy output from the lamps is largely in the Infra-Red (IR) range so that heating results from coupling mechanisms for IR energy to silicon. The primary coupling mechanism for heating silicon wafers is to free electrons that occur at temperatures above 700° C. issues with Radiant RTP for future generations of semiconductor devices are Limited temperature rise and cooling. Currently most rapid temperature rise rates that are reported are of the order of 300° C./sec and cooling rates of the order of 90° C./sec.

Coupling of radiant energy into the wafer is dependent on the emissivity (related to the reflectivity) of the surface and is thus dependent on the pattern and material. For fast temperature rise and cooling local pattern dependent differences do not average out and non-uniform thermal processing results.

Heating mechanism occurs only for a wafer temperature greater than 700° C. Low temperature anneals, such as fast spike-like heating and cooling from 100° C. to 800° C., cannot be done.

Plasma immersion and anneal:

Instead of the scan implantation method used by ion implanters, the wafer is placed in a plasma that contains the doping material. A voltage pulse is applied to the wafer with respect to the plasma potential that drives doping ions into the wafer. A rapid thermal anneal removes the crystal damage from the plasma implant. The advantage of this approach is that it could provide ion implantation at a lower cost. Issues with this approach are the same as those set forth above for the ion implant technique as well as those above for the RTP anneal. In addition, problems include:

Obtaining full wafer doping uniformity

Controlling unwanted impurities driven into the wafer from the plasma

Projection Gas Immersion on Laser Doping (PGILD):

A laser scans the wafer in a process chamber with the doping gas. The intense, localized laser heating rapidly diffuses the doping material into the silicon. An advantage of this approach is that very high heating power can be "dumped" into the surface to provide extremely rapid heating and cooling. A fundamental issue with this approach is that coupling of the laser energy into the silicon is pattern and material dependent making repeatable uniform processing difficult. Laser annealing of implanted silicon is under investigation to take advantage of the very rapid temperature rise and cool times possible. However, the fundamental issue of the silicon heating being pattern and material dependent remains.

Rapid thermal gas doping:

The wafer is placed in a furnace containing the doping material as a gas. A rapid temperature rise diffuses the doping material into the silicon. The fundamental issue with this approach for future device generations requiring shallow implants and diffusion is that temperature rise time and cool down is limited. Maximum rise times of 100° C. using forced air oven convection have been reported.

It is known that a hot gas stream can be used to heat a substrate and that given a sufficiently intensely hot gas stream that heating could be very fast. It is generally understood in the prior art that use of intense hot gas streams tends to damage the substrate at which the stream is directed. The International Patent WO9745856, "Method for treating articles with a plasma jet," inventors Tokmouline and Siniaguine, filed 1997, considers local heating and cooling as part of a treatment process in describing motion configurations for treating batches of wafers with a plasma jet. It is not within the scope of this prior publication, and, this publication does not give consideration to use of very high temperatures, or avoiding substrate damage at high temperatures and use of very rapid cooling.

For anneal and activation RTP applications of layers, spike-like temperature rise and cooling may be needed for crystal properties of the layer and to avoid parasitic device degradation effects. Ferro-electric materials for DRAM memory devices are under investigation and require very fast RTP for anneal. Proposed high dielectric constant, "high-k," insulators for CMOS gate dielectric applications include oxide materials such as tantalum oxide. The tantalum oxide can be annealed at a temperature less than 800° C. However, if the temperature rise and cool-down time are not sufficiently rapid, then a silicon oxide layer will form at the silicon I tantalum oxide interface partially negating the effect of the high-k tantalum oxide dielectric.

In a previously patent application of ours, which is not prior art as to the invention described herein, for processing by a hot gas generated by an atmospheric plasma, an etch application is described. This patent application is U.S. Provisional Patent application No. 60/156,407 entitled "Atmospheric process and system for controlled, rapid removal of polymers from high depth to width aspect ratio holes," by inventors Bollinger and Tokmouline, filed Sep. 28, 1999 and assigned to the same assignee as for this invention. This patent application has been incorporated as part of a regular U.S. patent application filed Sep. 28, 2000 by virtue of International Patent Application PCT/US00/27113, entitled "Atmospheric Process And System For Controlled And Rapid Removal of Polymers From High Depth To Width Ratio Holes", having a filing date of 28 Sep. 2000 and designating the United States. Heat flux to the subs strate in that application is typically in the range of $10^6$–$10^7$ W/m$^2$. Exposure times may typically be ~50 ms but in a given application the exposure time may significantly vary. For etch applications, an objective is uniform net removal of material from the substrate. Since reaction rates can vary with temperature, exposure times may be adjusted significantly to compensate. Also, in etch applications the substrate should not be significantly heated. e.g., surface temperatures should be less than about 200° C., since the processing may be done on devices further along in the manufacturing steps where the device materials may be damaged by a high temperature.

SUMMARY OF THE INVENTION

With one technique for thermal processing of substrate structures in accordance with the invention a substrate is exposed to a hot gas stream that is operated in a regime that yields a large thermal gradient through the substrate thickness during processing and is operated for a time period that is sufficiently short to enable a very rapid cool down of the areas treated by the hot gas stream.

This processing regime is obtained by a combination of high heat flux delivered to the substrate and low exposure time of any location on the substrate to the hot gas heat flux.

For high temperature very fast RTP for silicon devices, with a peak temperature in the range of 1,100–1450° C., heating power delivered to the substrate would be in a range of greater than about $5 \times 10^7$ Watts/m$^2$ up to about $10^9$ W/m$^2$. The exposure time to the hot gas stream is chosen according to the peak temperature needed and the heating flux used and would be generally less than about 8 ms.

The uniqueness of our invention is not just the parameter range of heat flux and exposure time but that in the properly chosen combination, thermal processing can be done in a regime that preserves a large temperature differential through the substrate thickness. This will give very high heating and cooling, of the order of about $\sim 10^{5 \circ}$ C./sec, with no substrate damage or deformation. It is not only critical that exposure times be in the range to give a large temperature gradient through the substrate thickness but also that in a given RTP process the exposure times are stable and have very small variations.

With a technique in accordance with this invention Rapid Thermal Processing (RTP) of substrates, particularly semiconductor substrates for microelectronic devices and optoelectronic devices are achieved. As a result the following structures and application are obtainable:

Formation of very high electrical conductivity structures in single crystal semiconductor substrates such as silicon and compound semiconductors such as gallium arsenide.

Formation of very shallow electrically conductive structures with sharply defined doping concentration boundaries in single crystal semiconductor substrates.

Annealing and activation of deposited layers that require very rapid heating and cooling.

These structures and application are achievable because the following significant advantages of the invention arise while treating substrates for the manufacture of semiconductor devices in accordance with the invention, namely:

A very rapid heating and cool-down of the surface of substrates with heating and cooling times greater than $10^{3 \circ}$ C./sec and can be greater than as $10^{5 \circ}$ C./sec. Such rapid heating and cooling will be needed to meet specifications for devices planned for generations beyond 2005.

Attaining a high temperature of the active surface of the substrate without permanent distortion or defects. Temperatures that can briefly melt the surface of the silicon substrate are obtainable resulting in significant improvements in electrical conductivity.

Heating of the substrate with uniform thermal processing can be achieved in a manner that is insensitive to the surface characteristics of the substrate such as patterning and material layers.

A heating method for low temperature applications can be employed using a very rapid RTP. This enables one to anneal and activate thin layers (e.g. ~<1 micron) in temperature ranges less than 1000° C./sec. There are a range of very fast RTP relatively low peak temperature needs, less than 1000° C., for annealing and activating materials that would enable the manufacture of higher performance advanced devices with new materials.

With a process in accordance with the invention a particularly high degree of temperature control and uniformity, better than 1% with a corresponding high process throughput, is achievable, both within a wafer and from wafer-to-wafer. There is currently no commercially system that can meet these requirements or that is projected to do so. Except for the invention disclosed herein, we know of no method under investigation that will have the capability to meet these requirements.

With a process in accordance with this invention substrate heating can be done in two different regimes characterized by a nearly constant temperature through the substrate thickness during heating and cooling; and by a large temperature differential through the substrate thickness.

As described herein for one embodiment in accordance with the invention heating of a substrate is done by gas conduction wherein the gas heating power density is sufficiently high, preferably above about $5 \times 10^7$ W/m$^2$ and with the dwell time of the substrate being treated within the hot gas stream being sufficiently low to create a high temperature gradient within the substrate. Sharply defined, shallow, high conductivity structures in silicon can be formed by rapidly bringing the silicon temperature to temperatures greater than 1100° C. followed by very rapid cooling.

Higher conductivities can be obtained by our invention for a Rapid Thermal Process (RTP) using a very hot gas stream capable of providing a very rapid temperature rise of the substrate surface to a high temperature followed by very fast cooling. The more rapid the temperature rise and cooling, the higher the nonequilibrium doping concentration is obtained without the doping atoms agglomerating to form non-crystal defects. A very high conductivity could be obtained by an extremely fast spike-like temperature rise and cooling profile that instantaneously raises the surface of the substrate, for silicon about 1410° C., to obtain a solubility concentration for liquid silicon.

Heating by gas conduction avoids the surface optical emissivity dependence issue of the laser and radiant RTP methods. Heat transfer to the substrate is then independent of patterning used in manufacturing microelectronic devices. Since a hot gas stream capable of carrying a high heat flux to the substrate must be used to obtain very fast RTP, a preferable approach to obtain the high heat flux is to use a gas stream that is smaller than standard substrate sizes, such as 200 mm to 300 mm diameter silicon wafers. Uniform thermal treatment is then obtained with a programmed movement of the substrate relative to the hot gas stream. To avoid hydrodynamic stabilization issues arising when one moves a hot gas stream, it is preferable, though not absolutely required, to move the substrate through a stationary hot gas stream.

Thermal treatment includes annealing or activation of the substrate surface and deposited layers, and doping of the substrate to give electrically conductive structures. Single crystal doped structures may be obtained using hot gas RTP by:

1. Thermally annealing previously implanted structures.
2. Diffusing the doping atoms into the substrate from a patterned layer deposited on the substrate surface.
3. Diffusing the doping atoms into the substrate from the hot gas stream. A hard mask, such a silicon nitride of oxide, which would be stripped in a later step, would provide the patterning for the diffusion of the doping atoms into the substrate.

Thermal treatment of this invention differs fundamentally from hot ovens approaches that use forced, convective gas flow to heat the substrate. For oven heating with convective gas flow, the gas temperature does not greatly exceed the peak temperature reached by the substrate during processing. Whereas, for a hot gas stream RTP approach in accordance with the invention, the temperature of the gas stream at the boundary layer over the substrate will be in the range of 2 to 30 times the peak temperature reached by the substrate during processing. It is this large temperature gradient established by the invention near the substrate surface that enables a very rapid heat transfer of this invention.

It is, therefore, an object of the invention to provide a process for a rapid thermal treatment involving fast heating and fast cooling of the gas treated areas of a substrate used to make semiconductor devices while using a very high temperature hot gas stream whereby excellent doping and annealing processes can be carried out to manufacture shallow substrate structures having sharp doping boundaries.

These and other objects and advantages of the invention can be understood from the following detailed description of an embodiment in conjunction with the drawings.

DETAILED DESCRIPTION OF THE DRAWINGS

Figure 8:
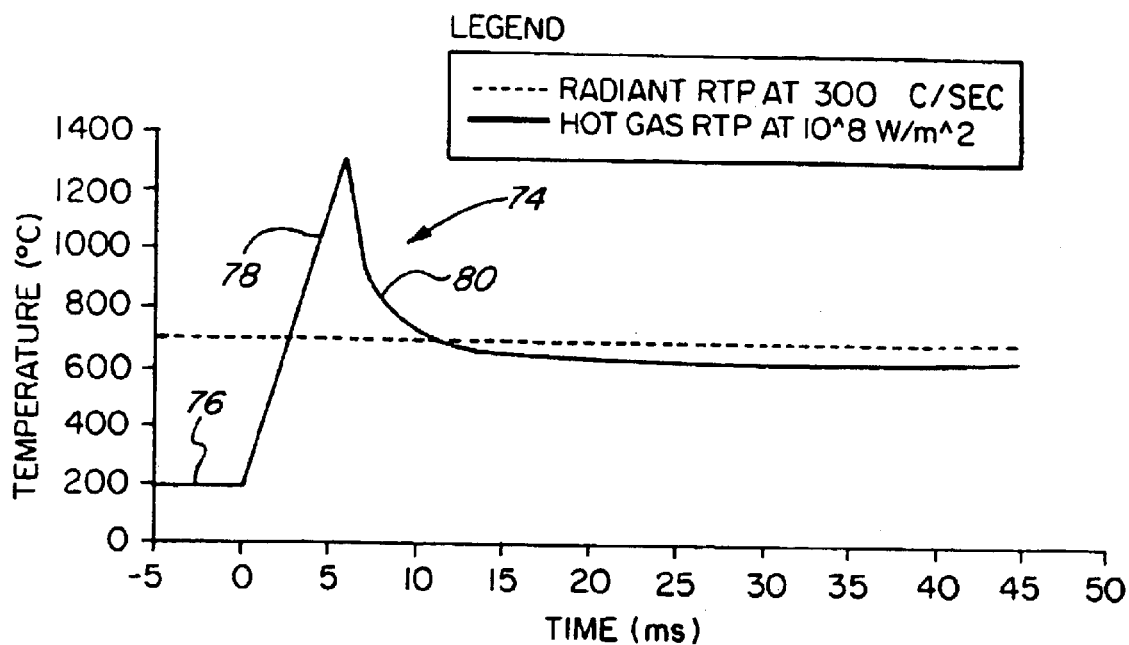
FIG. 8 is a modeled plot of heating and cooling rates for the front surface of a silicon wafer in the regime of a large temperature differential through the wafer thickness and with heating and cooling rates of $10^{5\circ}$ C./sec.

With reference to FIG. 8 a plot 74 is shown of the rise 78 and fall 80 in temperature as a function of time using a hot gas treatment in accordance with the invention. The plot 74 shows that the hot gas stream is sufficiently high in temperature and power, at least about $5 \times 10^7$ Watts/m$^2$, to raise the front surface of a silicon wafer substrate to 1300 degrees C. in a short time. The time is sufficiently short so that the time to cool the substrate to below the critical temperature of about 800 degrees is substantially shorter than that for a conventional, radiant RTP, thermal processing technique having a maximum temperature rise rate of 300 degrees/sec and cooling rate of 90 degrees/sec. The fall 80 of plot 74 during cooling to below 800 degrees C. is also substantially faster than the cooling rate obtained using a conventional as shown with curve 22 in FIG. 6. (Below 800 degrees C. further doping or annealing activities tend to cease in silicon.) The hot gas heating time occurs very fast as shown with the curve 78, about $10^5$ degrees C./sec, while the cooling occurs very fast as shown with curve 80 of plot 74, about $10^5$ degrees C./sec.

Figure 1:
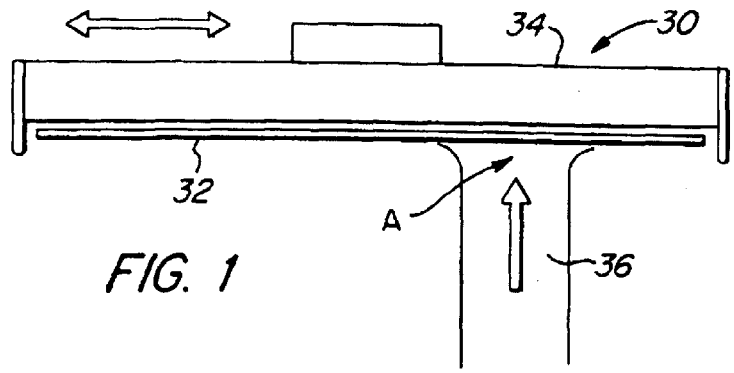
FIG. 1 is a schematic view of the concept of processing a substrate using an intense hot gas stream to obtain very rapid heating and cool-down of the substrate surface exposed to the hot gas treatment area in accordance with the invention.
Figure 2:
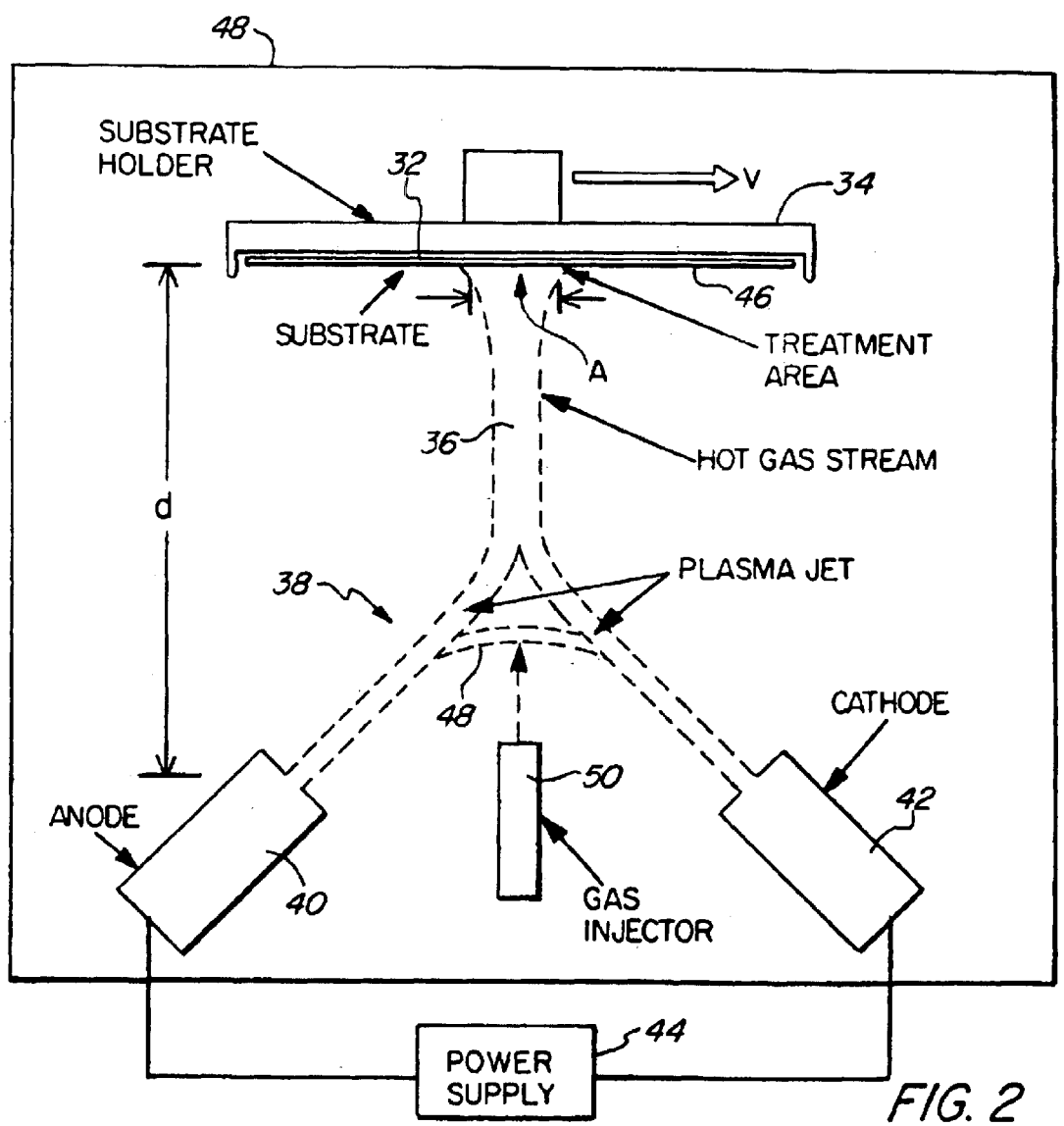
FIG. 2 is a schematic side plan view of an atmospheric plasma processing system that can be used to generate the hot gas stream needed for very rapid heating and cooling in accordance with the invention.

With further reference to FIGS. 1 and 2 the concept for the technique of this invention is shown at 30. A semiconductor substrate 32 is held upside down by a substrate holder 34 of the vortex type although other holding methods may be used. A suitable atmospheric hot gas stream 14 can be generated by an atmospheric plasma system as shown in FIG. 2. A hot gas stream is formed by an arc type plasma 38, sometimes referred to as a plasma jet, generated between an anode 40 and cathode 42 powered by a power supply 44. The hot gas stream 14 is directed onto the substrate or wafer surface 46.

Figure 3A:
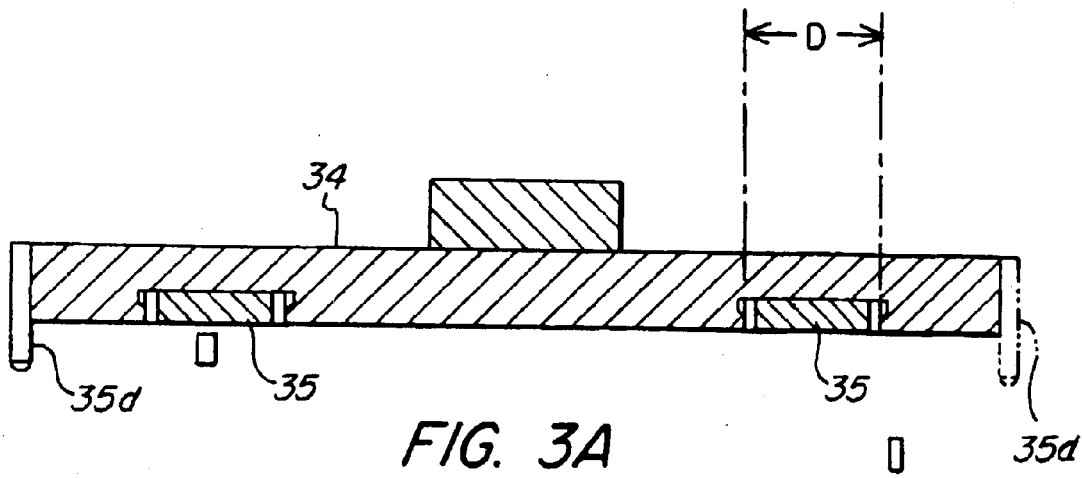
FIG. 3A is a schematic side cross-section view of a non-contact vortex type substrate holder with which a rapid thermal processing technique in accordance with the invention can be practiced.
Figure 3B:
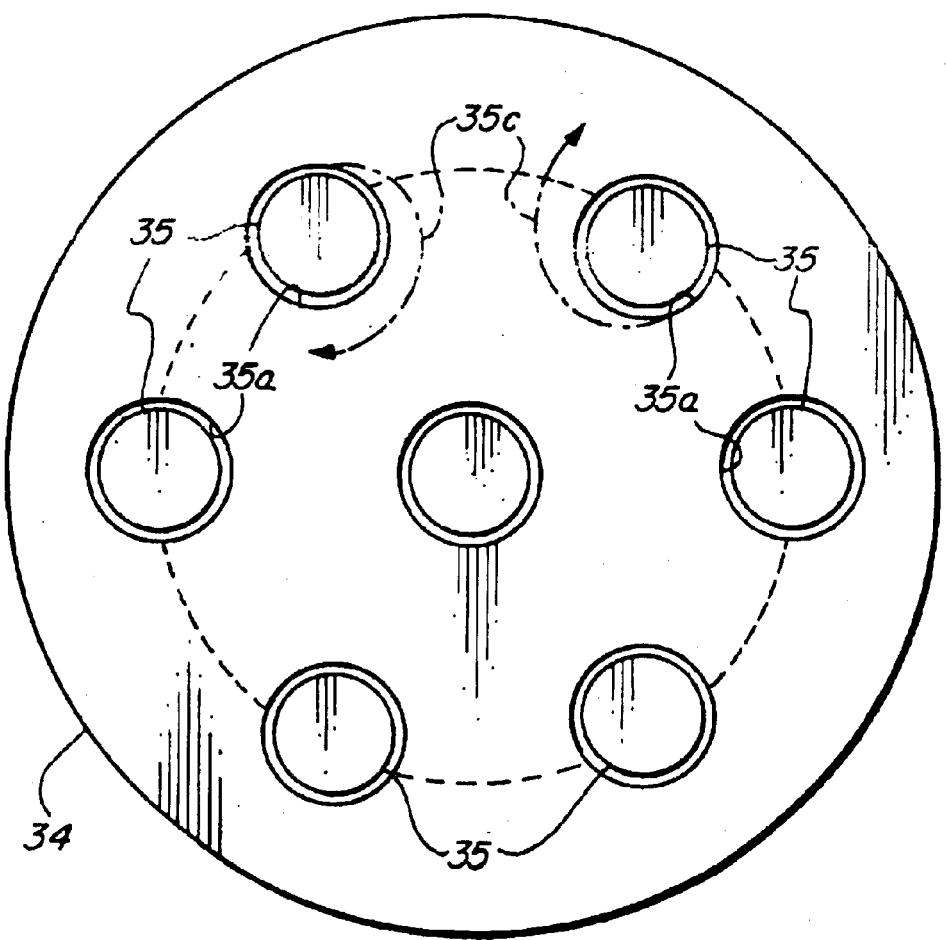
FIG. 3B is a bottom view of the substrate holder of FIG. 3A.

The non-contact vortex type substrate holder 34, which has advantages for this application is shown in FIGS. 3A and 3B. The holder 34 includes vortex chucks 35 and may be as described in a copending U.S. Patent Application filed on Oct. 12, 2000 and previously identified on the first page of this specification and filed by the same Assignee as of this invention and the same inventors. Alternatively one may include such prior art features as described in the International patent WO 97/45862, "Non-contact holder for wafer-like articles," inventors Siniaguine and Steinberg, published Dec. 4, 1997.

The substrate holder 34 for this application meets a requirement of not rigidly holding the substrate 32 so as to avoid the introduction of stress into the substrate caused by temporary thermal warping due to the high and localized heat input. The holder 34 further should enable a rapid cool-down of the substrate by rapidly removing heat from it and bring the substrate 32 to a fixed and controlled ambient temperature when it is outside the processing region defined by the gas stream 36.

FIGS. 3A and 3B show six vortex chucks 35 each consisting of an annular channel 35a. A stream of gas, such as nitrogen, is injected tangentially into the upper section of each annular gas channel 35a of outside diameter D. D may be in the range of 0.5 mm to 5 mm. The vortex chuck 35 may consist of an open hole rather than an annular ring, with the gas then introduced tangentially at the top of the open hole. As a result of the gas flow injected into each vortex chuck 35, the vortex chucks create an outward spiraling stream of gas 35c from the diameter D in the gap between the holder, shown for two vortex locations in FIG. 3. This outward spiraling gas flow generates a low pressure area inside the diameter D at each vortex chuck. The low pressure areas over each vortex chuck create the non-contact holding force for the substrate.

The substrate 32 is prevented from sliding away from the holder surface by a set of limiters 35d. The substrate holder is moved through the hot gas treatment area by means of an actuator attached to the holder, not shown.

The size of the hot gas stream 36 treatment area, generally denoted as A, is where the stream 36 is incident upon the substrate surface 46. The area A is approximately 2 cm in diameter, normally less than the size of the substrate 32 to be processed (e.g., a 200 mm or 300 mm diameter silicon wafer). Consequently, the entire substrate surface 46 is treated by multiple passes of the wafer 32 through the treatment area using a motion configuration that provides for treatment over the full substrate area. Relative motion of the substrate with respect to the treatment area is programmed so that uniform treatment can be obtained. Motion configurations can be by way of step and scan or by way of rotation with translation of wafer 32. The means to obtain uniform thermal processing is shown in FIGS. 12 to 16.

With reference to FIG. 2, the atmospheric hot gas stream 36 is generated with apparatus 38 within a sealed chamber 48. The atmospheric plasma generating system 38, often referred to as a plasma jet, has previously been described; see U.S. Pat. No. 6,040,548, by Siniaguine, entitled "Apparatus for generating and deflecting a plasma jet". The apparatus 38 uses a high temperature, arc type plasma generated in an inert gas such as argon between two electrode subassemblies 40, 42 that serve as an anode and cathode for the arc discharge 48. The arc 48 formed by the electrode configuration creates the stream 36 of hot gas to the substrate surface 46.

The substrate or wafer 32 to be processed is moved through the treatment area formed by the hot gas stream 36 using a suitable actuator that is not shown. Other suitable ambient gases may be employed inside the sealed chamber 48.

A gas injector 50 may be used to inject a gas. Without a flow of gas from the gas injector 50, the hot gas stream 36 is composed primarily of the inert gas from the two electrode assemblies and from the process chamber 48 ambient gas that is entrained into the hot gas stream. For this reason, it is important to have a sealed process chamber to control the process chamber, ambient gas. If air were to be present during a high temperature RTP process oxygen could be diffused into the substrate and cause oxygen to precipitate into crystal defects.

For diffusion applications, a gas containing the doping atoms to be diffused into the substrate may be injected into the hot has stream by the gas injector 50. The hot gas will dissociate the injected material, gas or powder, into its elemental form so that the doping atoms, such as for diffusing boron into silicon, are delivered directly to the substrate surface 46.

The temperature of the hot gas stream, at the boundary layer over the substrate, may be controlled by controlling the distance d of the electrode assemblies 40,42 from the substrate 32 as well as the electrical power into the arc type plasma 36. Typical power parameters for driving the arc plasma for RTP applications may be in the ranges of 125 to 250V and 60 to 150 Amps and such power is set with the power supply 44.

The size of the treatment area generally denoted as A, where the stream 36 is incident upon the substrate surface 46, is approximately 2 cm diameter, normally less than the size of the substrate 32 to be processed (e.g., a 200 mm or 300 mm diameter silicon wafer). A may be in the range of 0.5 cm to 5 cm. A need not be circular but can be elliptically shaped by choice of the plasma generation parameters and gas injected into the hot gas stream, such as by the gas injector 50.

The entire substrate surface 46 is treated by multiple passes of the wafer 32 through the treatment area using a motion configuration that provides for such treatment. The relative motion of the substrate with respect to the treatment area is programmed so that uniform treatment can be obtained. Motion configurations can be by way of step and scan or by way of rotation with translation of the subco strata 32.

When an atmospheric flow process is used as in FIGS. 1 and 2, hydrodynamic flow characteristics apply. The flow of the hot gas stream 36 onto the substrate surface 46 forms a thin hydrodynamic boundary over the surface of the substrate that is approximately 100 microns thick. The gas temperature drops from the temperature in the hot gas stream to the substrate temperature across this boundary layer. The gas temperature on the hot gas stream 36 side of the boundary layer may be in the range of 5,000–12,000° C. with a preferable range being about 9,000 to about 12,000° C. The wafer temperature depends on the process parameters and the velocity of the substrate through the hot gas stream treatment area A, as described below. Heat flux from the hot gas stream through the boundary layer to the substrate surface should be in the range of about $5 \times 10^7$ to about $10^9$ W/m². It is usually preferable to use an inert gas for the hot gas stream 36 to avoid diffusing unwanted impurities into the substrate 32. A doping gas may be introduced into the hot gas stream to provide doping atoms for diffusion into the substrate.

Figure 4:
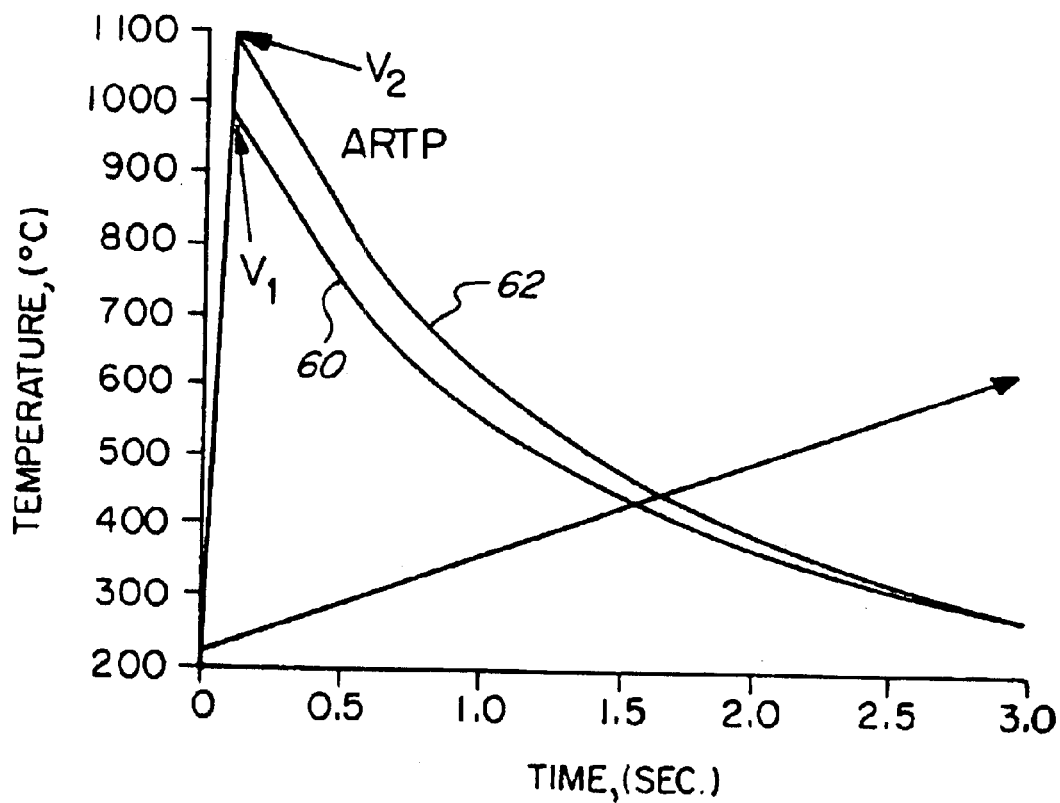
FIG. 4 is a plot of modeled heating and cooling rates for two different velocities of a substrate as it passes through a hot gas stream and shows the method for controlling the peak temperature in accordance with the invention.

Control of the peak temperature of the substrate 32 reached during exposure of local area A of the substrate to the hot gas treatment area is obtained by control of the substrate velocity through the hot gas treatment area. For a given process, the heat flux delivered by the hot gas stream 36 is constant. The velocity of the substrate 32 through the gas stream 36 varies the heating time of local area A of the substrate 32. On entering the hot gas stream treatment area, the temperature of the substrate surface increases until that local area exits the treatment area A. Increasing the substrate velocity decreases the exposure time of that local area of the substrate, and consequently, reduces the maximum temperature reached by that area of the substrate. FIG. 4 illustrates the concept of controlling maximum temperature by the velocity. The programmed motion may used to correct for small systematic variations in the thermal treatment of the substrate such as may occur near the edge of the substrate 32.

Control of the peak temperature reached during exposure of a local area of the substrate 32 to the hot gas treatment area A is obtained by motion control. For a given process, the heat flux delivered by the hot gas stream is constant. FIG. 4 illustrates the process of controlling maximum temperature by the velocity of the substrate 32. At a time of 0 seconds the hot gas stream treatment area A of the substrate 32 moves over the position on the substrate for which the temperature profile is plotted in FIG. 4. The temperature rapidly rises until that portion of the substrate 32 moves out of the hot gas stream treatment area A. For the plot 60 associated with a velocity $v_1$, this temperature is 1,000° C. For a velocity $v_2$ that is less, the local area on the substrate is exposed to the hot gas stream 36 for a longer period and, therefore, result in a higher peak temperature of 1100° C. for the plot 62.

The example shown in FIG. 4 is for a silicon wafer. The two temperature vs. time profiles are at a hot gas heat input of $10^7$ W/m$^2$, for the upper plot 62 $v_2$=0.12 m/sec and for the lower plot 60 $v_1$=0.13 m/sec. Methods to calculate the wafer temperature vs. time profile are described in following sections.

A very rapid cool-down rate is essential to very fast RTP. Rapid cool-down of the substrate surface is obtained by 2 mechanisms.

1. Conductive heat transfer may be by gas conduction or conduction to a solid plate in contact with the wafer. It may be argued that conduction to a solid plate too is gas conduction since heat transfer to the plate is primarily across a very narrow gap by the gas in that gap. Heat from the substrate area exposed to the hot gas treatment area will conduct from the higher temperature substrate surface to the surrounding gas or to a cooled contact plate. For this invention there are advantages to using a non-contact wafer holder so that only the thermal mass of the substrate itself contributes to the heating and cool-down rates. For hot gas stream heating using a non-contact vortex type substrate holder, shown in FIGS. 3A and 3B, the major heat transfer out of the substrate is from the backside of the substrate to the gas flowing in the gap between the vortex chucks 35 and the substrate 32. The gas transfers heat across the gas gap, typically less than 1 mm, to the temperature controlled substrate holder.

2. Conductive heat transfer in the bulk material of the substrate 32 will occur in two directions namely: 1) lateral heat conduction, parallel to the substrate surface 46; and 2) heat transfer through the wafer thickness, perpendicular to the substrate surface 46. Semiconductor substrates are generally very thin (e.g., 0.75 mm for a 200 mm standard silicon wafer) compared to the heating area, typically about 20 mm in diameter for the atmospheric plasma system of FIG. 2.

With a geometry wherein there is a large ratio of the heating area to substrate thickness, heat conductivity from the heated area by lateral heat conduction is relatively ineffective. If a large temperature differential can be developed through the wafer thickness during heating, the mechanism of heat transfer through the wafer thickness can provide an additional, very rapid cool-down of the substrate surface 46. Heat is then conducted away from the surface 46 to the bulk of the substrate itself. This mechanism is described further in the discussion of FIGS. 7 to 11.

Two heating regimes may be characterized by the dominant cooling mechanism of the surface after immediate exposure to the hot gas stream. To illustrate, consider bringing the surface of the substrate to the same temperature by a velocity $V_L$ with an input, gas heating power $W_L$; for a silicon wafer $V_L$=0.1 m/sec and a heating power of $10^7$ W/m$^2$ will give a peak temperature of ~1300° C. At a much higher input power $W_H$, the same temperature can be obtained for a significantly higher velocity $V_H$. For a silicon wafer with $W_H$=$10^8$ W/m$^2$, a surface temperature ~1300° C. would be obtained for a velocity $V_H$=1.6 m/sec. Although the same substrate surface temperature is reached, the heating and cooling characteristics are very different such that we refer to them as different regimes: a high heating power using a high velocity and a low heating power regime using a lower speed.

In general, heating of a homogeneous material is governed by the time dependent heat equation:

$$\rho c_p \partial T/\partial t = k\nabla^2 T + Q \tag{1}$$

where: T=T(x,y,z) is the temperature of the body; $\rho$ is the density; $c_p$ is the heat capacity; k is the thermal conductivity; and Q=Q(x,y,z) is the net heat input/output.

Low Heating Power Regime

Figure 5:
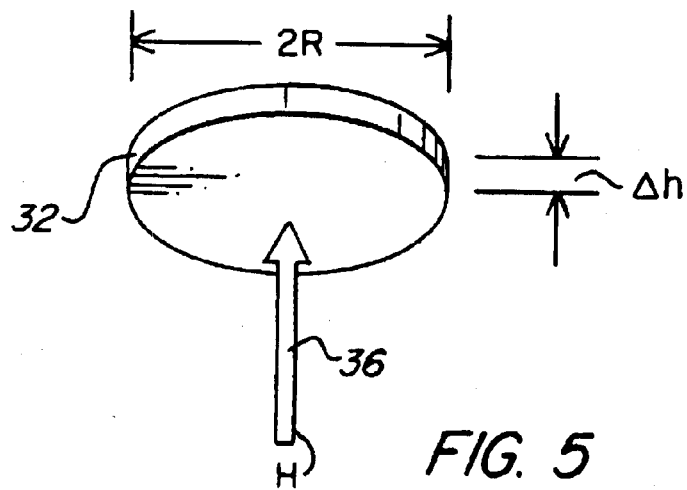
FIG. 5 is schematic view of a simple model for heat transfer to a substrate from a hot gas stream.

For the low power regime, a simple physical model can provide the substrate heating and cooling and the differential equation (1) does not need to be explicitly solved. For this regime, the time that a given area of the substrate 32 is exposed to the hot gas stream is long compared to the time it takes for the heat to conduct through the substrate from the heated side to the back side. And, for the case that the heating area is much larger than the substrate thickness, as is the case for silicon wafers, thickness of a 200 mm wafer ~0.75 mm compared to a heating area ~20 mm in diameter, the heat flow out of the heated area is low compared to the heat input. The heating of the local volume of the substrate can closely approximate the temperature rise of a local area of the substrate. With reference to FIG. 5, for a circular hot gas stream 36 treatment area of radius R and total input heat flux H onto a substrate 32 of thickness $\Delta h$, the local substrate volume element $\Delta V$ undergoing heating is:

$$\Delta V = 2\pi R^2 \Delta h \tag{2}$$

The total input power H (i.e., Watts) expressed in terms of the heat per unit area W (i.e., Watts/m$^2$) is:

$$H = 2\pi R^2 W \tag{3}$$

For a velocity of the substrate through the hot gas stream V, the time t, during which the volume element $\Delta V$ is exposed to the heating flux H is:

$$t = 2R/V \tag{4}$$

Total heat input Q (i.e., joules) is:

$$Q = Ht = 2\pi R^2 W (2R/V) \tag{5}$$

Temperature rise is related to the total heat input into a volume with density p and heat capacity $c_p$ by the well-known equation:

$$\text{Heat input} = \rho c_p (\text{volume})(\text{Temperature rise}) \tag{6}$$

Equations (2), (3), (5) and (6) then give the simple expression for calculating the temperature rise:

$$\Delta T = 2RW/\rho c_p \Delta h V \tag{7}$$

For the low power regime, cooling time is relatively long compared to the heating time: yielding a heating rate ~$10^{4°}$ C./sec and a cooling rate ~1 sec. The cooling can then be considered independent of the heating and starting at the time heating from the hot has stream treatment area moves off a given location.

The primary cooling mechanism with the non-contact vortex type wafer holder is by forced gas convective heat transfer by the gas flowing from the vortex chucks. The heat removal rate from the backside of the substrate $W_{out}$ can be expressed as:

$$W_{out}C_1(T_{wafer}-T_{cool\ gas}) \quad (8)$$

where: $T_{cool\ gas}$, and $T_{wafer}$ are the gas temperatures for the cooling gas flowing to the substrate from the substrate holder and the substrate respectively; $C_1$ is the convective gas film coefficient, calculated from the known gas flow and composition conditions.

For the low power heating regime, equations (7) and (8) describe the heating and cooling occurring at a given position with motion of a substrate 32 through the hot gas stream 36. The same dependence can be arrived at by applying the proper boundary conditions to the general time dependent heat equation (1) as will be evident from the following discussion of the high power heating regime.

Figure 6:
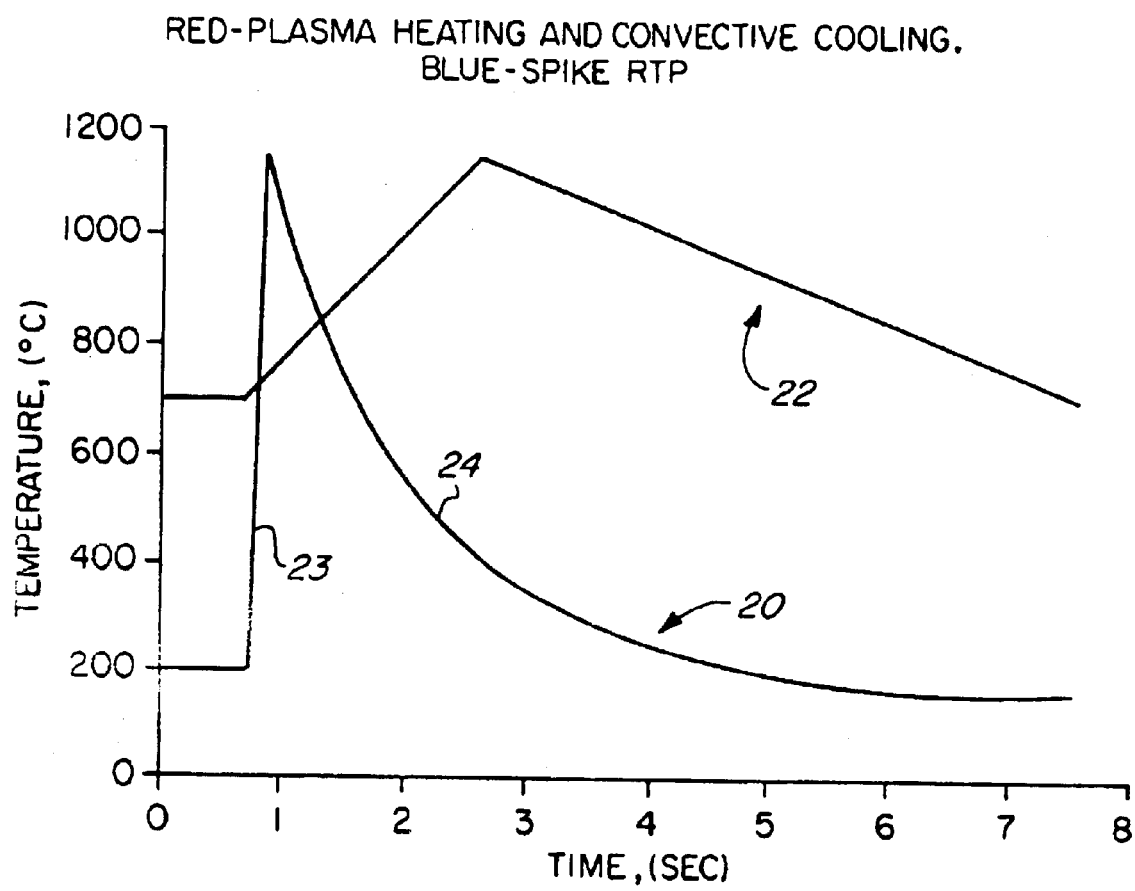
FIG. 6 is a plot of modeled heating and cooling rates for a silicon wafer in the regime of a low temperature differential through the wafer thickness of Figure in comparison with heating and cooling rates obtained by a conventional radiant RTP process.

FIG. 6 shows a low heating power regime with curve 20 with the heating and cooling plotted with curve 20 for a silicon wafer with an input power of $10^7$ W/m$^2$ and a velocity of 0.12 m/sec giving a peak temperature ~1,100° C. In this Figure, at time 1 sec the hot gas stream starts crossing the first point on the surface 46 of the wafer 32 for which the temperature is plotted. The temperature rises at a rate of about ~$10^{4°}$ C./sec until the hot gas stream 36 has moved off of that point; cooling at a rate of seconds then begins.

For comparison, a published plot of temperature rise and cooling time for a commercially available Radiant RTP system is plotted with curve 22 in FIG. 6. see "Thermal Processing Options," A. E. Braun, Semiconductor International, p56–64, May 1999. For the Radiant RTP case, the rapid heating starts at 700° C. because, as previously described, the radiant IR energy couples into silicon effectively only for temperatures greater than 700° C. For annealing and diffusion of dopant in silicon this is acceptable because diffusion rates are negligible for temperatures less than about 800° C. The temperature rise rate of 250° C./sec for Radiant RTP is far slower that the hot gas RTP rise rate of about $10^{4°}$ C./sec for curve 23. The cooling rate for hot gas RTP is 600° C./sec for curve 24 of plot 20, compared to about 90° C./sec for Radiant RTP.

Two limitations of hot gas RTP in the low power-heating regime are:
1. Cooling rate: While much faster than Radiant RTP, it is evident that in the low heating power regime that the thermal budget impact is limited by the cooling rate.
2. For high temperatures, such as those approaching the melting point of silicon, the front and back surface temperatures are nearly equal. Hence, the substrate 32 is subject to permanent distortion and associated crystal defects.

High Heating Power Regime of the Invention

For a high heating power regime, in excess of about 5×$10^7$ W/m$^2$, heat input to the substrate 32 occurs over a time period that is short compared to the time it takes to establish a nearly uniform temperature throughout the substrate thickness. For this regime the surface 46 of the substrate exposed to the hot gas stream 36 can develop a much higher temperature than the back surface. This large temperature differential through the substrate thickness provides the significant advantages of:
1. Very fast cool-down time of the front surface for high thermal conductivity substrates.
2. No permanent distortion of the substrate while subjecting it to high temperatures. The front surface 46 of the substrate 32 can be raised to the melting point while the bulk of the substrate stays at a much lower temperature and maintains the structural integrity of the substrate.
3. No crystal defects.

For the high heating power regime, the general time dependent heat equation (1) must be solved to give the substrate temperatures during processing. For the analytical results described in this invention we again consider a model in which the substrate is thin compared to the size of the hot gas heating area A. The model then assumes that heat transfer effects and variations of temperature in the directions parallel to the wafer surface can be neglected. Such an assumption is justified during initial stages of the heating process, when heat transfer in the z direction (due to intense heating from the front surface) dominates over heat transfer in x and y directions (which results from developing a temperature gradient in these directions). We then consider a one-dimensional non-steady heat transfer model, where temperature T is considered to be a function of time t and a distance z from the front (heated) surface of the wafer: T=T(t,z).

Heat input by the hot gas stream to the front surface is treated by the front surface boundary condition and equation (1) for this case reduces to the one-dimensional parabolic differential equation:

$$\rho c_p \partial T/\partial t = k\partial^2 T/\partial z^2 \quad (9)$$

subject to the front and back surface boundary conditions.

As previously described, the stream 36 of hot gas onto the wafer surface 46 sets up a hydrodynamic boundary layer with a temperature dropping from that of the hot gas stream $T_{hot\ gas}$ (e.g., ~10,000° C.) to the substrate temperature $T_{wafer}$ across the boundary. The net heat flow into the front surface per unit area $W_{in}$ is:

$$W_{in}=C_2(T_{hot\ gas}-T_{wafer}) \quad (10)$$

where $C_2$ is the convective gas film coefficient calculated from the known gas flow and composition conditions. The front surface boundary condition, z=0, is:

$$-k\partial T(t,0)/\partial z=W_{in}(t) \quad (11)$$

From equation (8) The back surface boundary condition, z=$z_b$, is:

$$-k\partial T(t, z_b)/\partial z=C_1(T_{wafer}(t, z_b)-T_{cool\ gas}) \quad (12)$$

FIGS. 7 to 11 are plots that present results from numerical solution, for silicon wafer substrates, to the governing equation (9) subject to the front and back surface boundary conditions, equations (11) and (12). These plots illustrate the non-linear effect that arises when a very high heat gas stream 36 is applied to the wafer 32 and it is moved at a very high speed through the gas stream 36 in comparison to the case where a relatively low power hot gas stream is used.

Temperature Differential Through the Substrate Thickness

Figure 7:
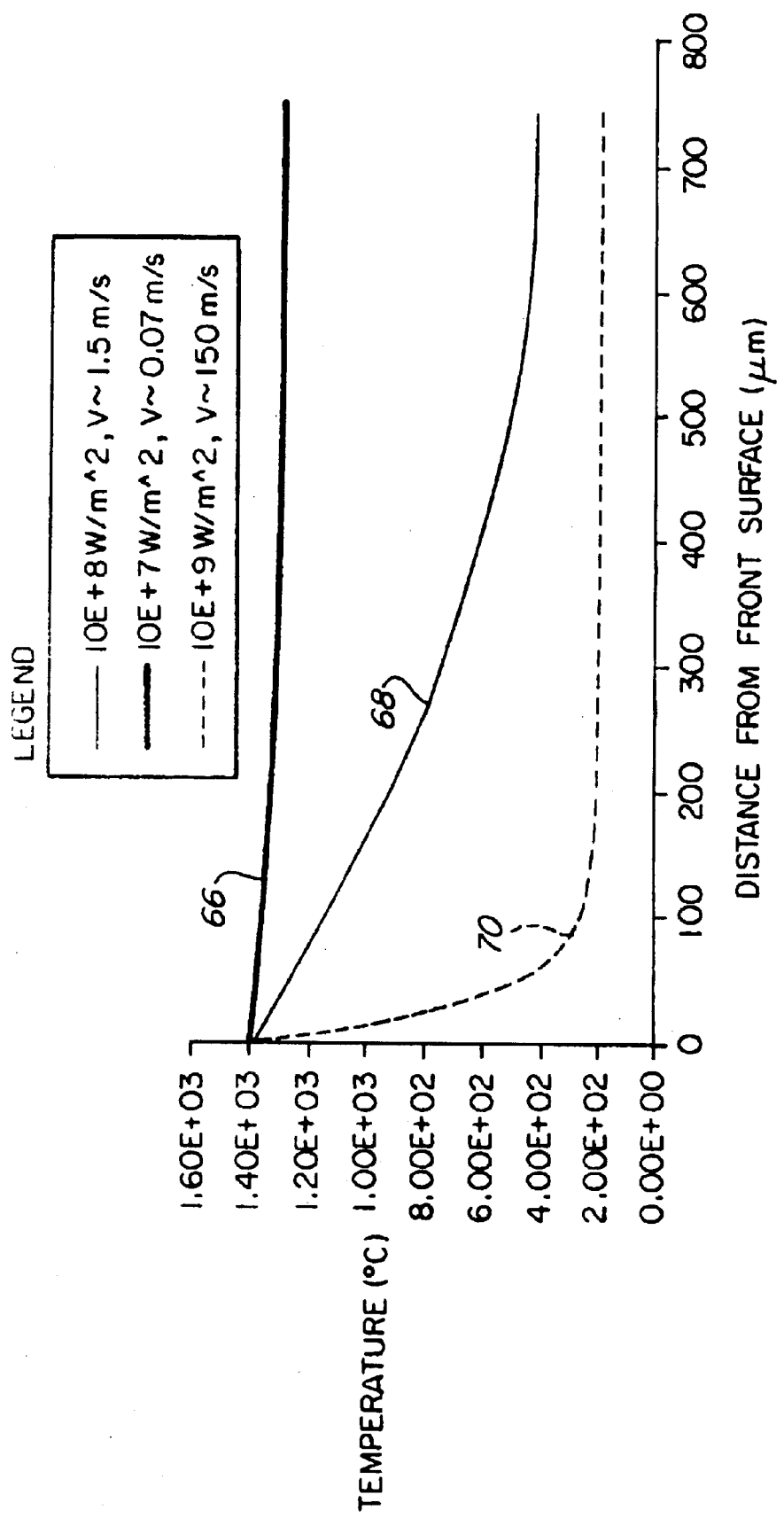
FIG. 7 is a diagram of modeled plots of temperature differential through the thickness of a silicon wafer for different input heating powers and gas stream traversals or velocities of the substrate with the same front surface peak temperature of the silicon.

FIG. 7 shows how a large temperature differential can be developed through the substrate thickness for the high heating power regime. This figure shows modeling results, plots 66, 68 and 70 for three different heat flux powers to a silicon wafer substrate respectively, $10^7$, $10^8$, and $10^9$ W/m$^2$. The plots give the temperature profile through the wafer thickness at the time when exposure to the hot gas heating area has just ended. The exposure time of the localized wafer area to the hot gas, determined by the velocity of the wafer through the hot gas treatment area, is set to give the same surface temperature of the wafer, 1400° C., close to the melting point of silicon, 1410° C.

In FIG. 7 "0" distance is the wafer front surface that is directly exposed to the hot gas and the back surface $z_b$=750 microns or 0.75 mm. For the lowest heat flux, $10^7$ W/m² and a corresponding relatively low velocity of 0.07 m/sec, there is a small temperature differential across the water. This is the low heating power regime referred to above.

At much higher heat flux powers for the high heating power regime, $10^8$ and $10^9$ W/m², and correspondingly higher velocities, a large temperature differential is developed across the wafer. Very high front surface temperatures may be obtained, such as the melting point of silicon, while the bulk of the wafer remains at a low temperature to provide structural rigidity to prevent permanent thermal distortion.

It is to be noted that the high heating power regime for a large temperature differential through the substrate thickness applies to low and intermediate peak temperatures as well (e.g., <900° C.). For a given input heating power, a large temperature differential is set up during the heating time by a sufficiently high velocity (i.e., short exposure time). Roughly, a velocity that gives a large temperature differential at a high input power will give a large temperature differential with a lower peak temperature than a lower input power. A factor that affects the scaling is thermal conductivity, for many materials thermal conductivity varies significantly with temperature; for silicon thermal conductivity decreases by a factor of approximately 8 between room temperature and 1400° C.).

Very Rapid Cool-down Rates

Temperature rise is a direct function of the input heating power. A more rapid temperature rise may be obtained by increasing the heating power. However, in RTP the integrated time spent at a higher temperature uses a significant portion of the allowable thermal budget. As is the case for the low heating power regime, a relatively slow coo-down time will then drive the thermal budget impact. A "spike-like" temperature vs. time thermal profile having both very rapid temperature rise and cool-down rates provides a high thermal processing temperature with a very low impact on the thermal budget.

By having an RTP process that develops a large temperature differential across the substrate thickness, heat can be removed from the substrate surface by conduction into the bulk of the substrate. For a substrate with a high thermal conductivity such as silicon this mechanism can provide a greatly enhanced cool-down rate at the higher temperatures where diffusion and activation occur and it is at the higher temperatures that the cool-down rate has an impact on the thermal budget. As previously discussed, for silicon, diffusion becomes negligible below 800° C. and in a thermal anneal of implanted silicon, for example, it is only the temperature above 800° C. that contributes to the thermal budget.

The greatly enhanced cooling mechanism of the high heating power regime at an input heat flux power of $10^8$ W/m² is shown with curve 74 in FIG. 8. At time "0" ms exposure to the heat flux begins. curve 74 shows the front surface temperature rising from the ambient temperature level 76 of 200° C. to 1300° C. in 6 ms along curve portion 78 when the exposure to the heat flux ends. This illustrates a heating rate of greater than $10^{5°}$ C./sec.

The very effective cool-down mechanism of conduction of heat from the front surface into the bulk of the wafer now begins with curve portion 80 which shows a rapidly cooling of the wafer front surface 46, from 1300° C. to less than 700° C. in the next 6ms, at a cooling rate of about $\sim10^{5°}$ C./sec. When the front surface temperature comes to nearly equal temperatures at ~650° C., further cooling is at the rate at which heat is removed from the back surface of wafer 32.

Figure 9:
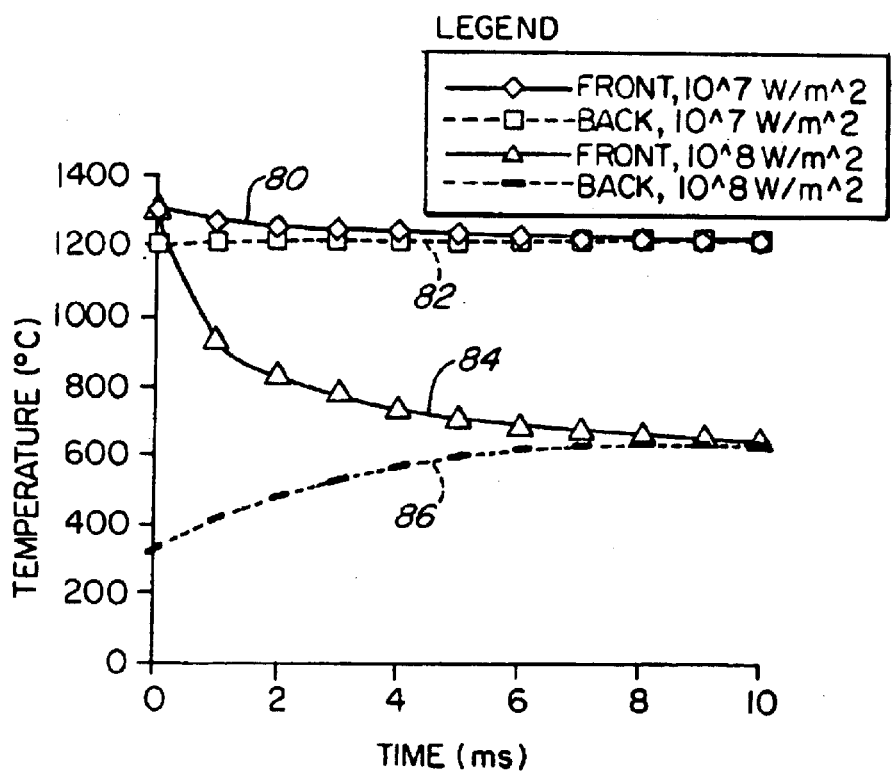
FIG. 9 is a diagram of modeled plots for cooling rates of a silicon wafer in two operating regimes of respectively low and high temperature differentials through the wafer thickness. Front and back wafer surfaces vs. time are shown.

FIG. 9 shows the two cooling mechanisms that are obtained with hot gas RTP in accordance with the invention. This figure shows the front surface and back surface cool-down rates of a silicon wafer substrate 32 immediately after exposure to the hot gas stream for two heating flux powers. At time "0" ms exposure to the hot gas heating area A has just ended. In the low heating power regime with the lower heat input flux of $10^7$ W/m² (upper two plots 82, 84), there is a low temperature differential through the wafer thickness. Consequently, the front surface temperature rapidly comes to the same temperature as the back surface and the cool-down rate is determined by the rate of heat removal by gas conduction from the wafer surfaces, primarily from the back surface.

In the high heating power regime of this invention with ten times higher heat input flux of $10^8$ W/m² there is a large temperature differential through the wafer thickness at time= 0. Consequently, there is a very rapid cooling of the front surface, at a rate of about $\sim10^{5°}$ C./sec, by thermal conduction from the surface 46 into the bulk of the silicon wafer. When the front surface temperature reaches the back surface temperature, of about ~650° C., the heat removal mechanism is gas conduction from the wafer surfaces.

Figure 10:
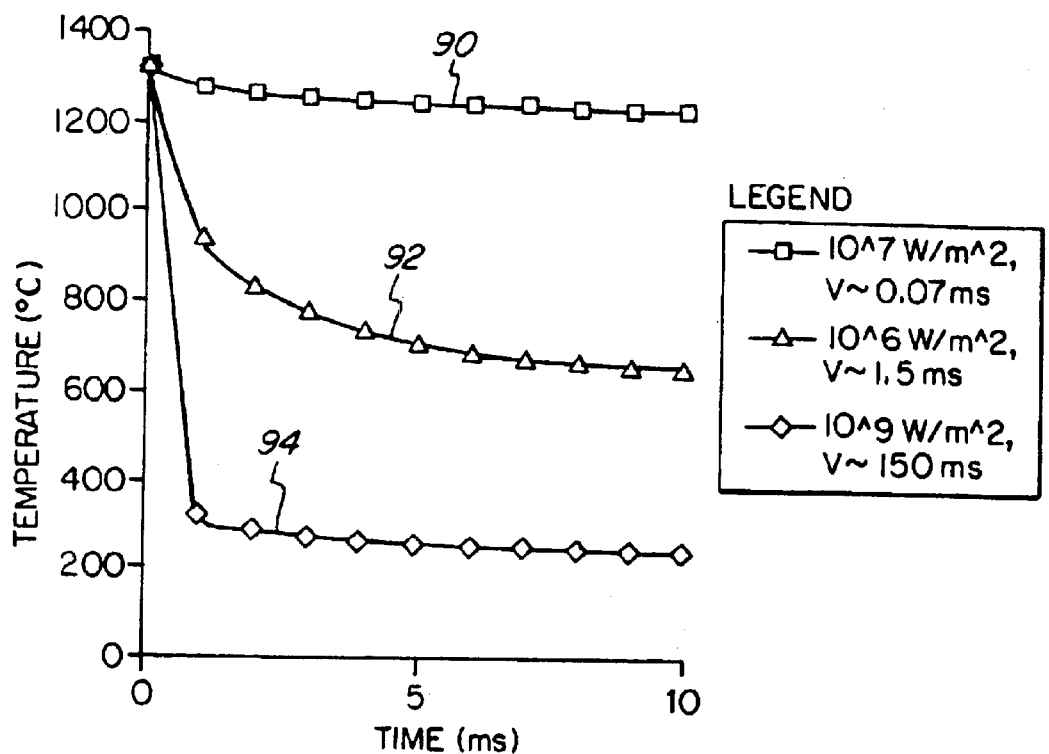
FIG. 10 is a diagram of modeled plots for cooling rates at three different input heating powers and velocities that yield the same front surface temperature.

Gas heat conduction from the wafer 32 may be increased above that shown in FIG. 9 such as by a lower gas temperature and increased gas flow from the vortex chucks 35. However, the most rapid cool-down of the front surface is obtained by the mechanism of heat conduction into the silicon enabled by retaining or establishing a temperature differential through the wafer thickness FIG. 10 shows the cool-down rates of the front surface 46 for three input heat flux powers, for curves 90, 92, 94 with the heating exposure time (i.e., velocity) set to give the same peak temperature. At time "0" ms for each of these plots coincides with the peak temperature and occurs when exposure to the hot gas heating area has just ended. The increasing temperature differential through the wafer thickness with increasing heat flux power in the gas stream, and corresponding increased velocity of the wafer through the gas stream as shown in FIG. 7, results in an increased cool-down rate. For formation of high conductivity, shallow silicon structures, rapid cool-down to a temperature below 800° C. is needed to allow abrupt doping concentration boundaries and to prevent unwanted diffusion into the silicon. For an input heating power of $10^8$ W/m², a wafer velocity through the hot gas stream of about ~2 m/sec is needed. Precision control of velocity at 2 m/sec is in the range of standard, commercially available motion control systems.

Figure 11:
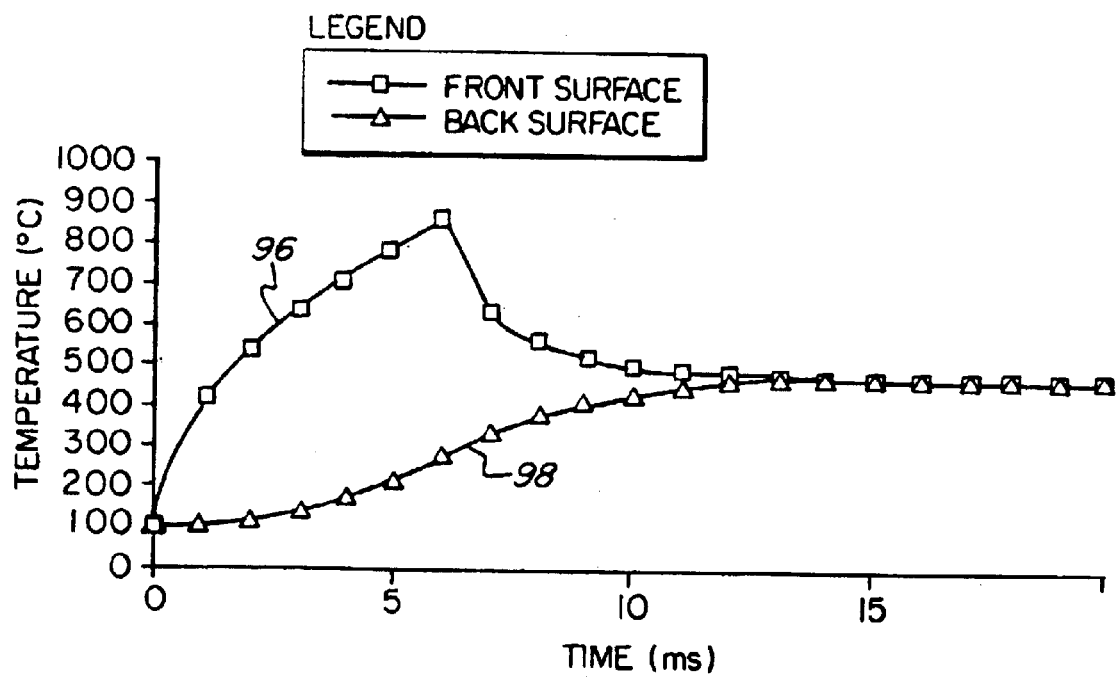
FIG. 11 is a diagram of a modeled plot showing very rapid heating and cooling rates for a silicon wafer with a relatively low peak temperature for a low temperature very fast RTP anneal process.

FIG. 11 shows a low temperature RTP cooling example with curves 96, for the front surface 46, and 98, for the back wafer surface. In this Figure time=0 is when exposure to the hot gas stream starts, the temperature rises during the exposure time to the hot gas stream at an input heating power of 5×$10^7$ W/m² and a velocity ~2 m/sec for curve 96. A peak temperature of 850° C., from a base temperature of 100° C., is reached in about 6 ms after which a rapid cool down of the front surface 46 from ~850° C. to ~500° C. occurs in about 4 ms.

The peak temperature and the temperature at which the front and back surfaces come to near the same temperature, corresponding to a slower cooling rate, may be adjusted by the input heating power and the substrate velocity.

Estimate for the exposure time to yield a large temperature differential

Equations (9), (11) and (12) must be numerically solved to accurately calculate the exposure time of an area of the substrate surface to the hot gas heat flux that will give a large temperature differential through the substrate thickness and consequent high cooling rate. It is instructive, however, to develop an approximating physical model that gives the driving variable dependencies and provides an estimate for an exposure time that divides the low and high input heating power regimes. The basis for this approximate physical model is that, to develop a large temperature differential through the wafer thickness, the heat input to the substrate surface must be much greater than the rate of heat transfer through the wafer to the back surface of the wafer. To model this we use the simple, well-known static equations for heat transfer. For temperature rise equation (6) and for heat transfer the equation:

$$\text{Heat transfer rate} = k(\text{area})(\text{Temperature change})/(\text{thickness}) \quad (13)$$

Where k=thermal conductivity.

For this approximate physical model, we consider the substrate as three equal layers each of thickness $\Delta h/3$. We estimate the temperature rise of the top, directly heated layer and then compare this to an estimate of the heat transferred through the middle layer to the back layer to give an upper value for the exposure time $t_E$ to the heat flux that gives a large temperature differential through the thickness. If the top layer were thermally isolated, equation (6) gives the temperature rise $\Delta T$ for the exposure time $t_E$ with an input heating power W to the top layer of thickness $\Delta h/3$ as:

$$\Delta T = 3 W t_E / \rho c_p \Delta h \quad (14)$$

We now estimate the heat transferred through the middle layer, thickness $\Delta h/3$, to the back layer during the exposure time $t_E$. We use equation (15) to estimate the temperature difference across the middle layer as $\Delta T/2$. For there to be a large temperature difference through the wafer thickness when exposure to the heat flux has ended, the heat transferred to the back layer must be significantly smaller than the heat input into the front surface. Since the back layer is one third the total wafer thickness we use:

$$\text{Heat transfer rate to back layer} = (1/2)(W/3) = W/6$$

as an upper value for estimating onset of the regime for a large temperature difference. Equation (13) then gives for the heat transfer rate through the middle layer to the back layer as:

$$(\text{area})W/6 = k(\text{area})(\Delta T/24)/(\Delta h/3)W = 9k\Delta T/\Delta h \quad (15)$$

Substituting for $\Delta T$ from equation (14) and solving for $t_E$ gives the estimate for the upper bound to the exposure time for the regime with a large temperature differential as:

$$t_E < \rho c_p \Delta h^2 / 27k \quad (16)$$

We note that this expression does not explicitly contain the input heating power; however since the heat capacity $c_p$ and the thermal conductivity k are somewhat temperature dependent for all materials there is an implicit dependence on the heat input by way of the temperature dependence of these variables.

For the case of a silicon wafer for heating to a peak temperature above 1200 degrees C., representative values for the variables in (16) are: $\rho=2.33\times10^3$ Kg/m$^3$; $c_p=700$ J/(kg degrees C.); $\Delta h=0.75\times10^{-3}$ m and k=40 W/(m degrees C.) which give:

$$t_E < \sim 10\times 10^{-3} \text{ sec} = 10 \text{ ms} \quad (17)$$

As previously described, actual numerical solution to the governing differential equations (9), (11) and (12) show a large temperature differential through the thickness of a silicon wafer for heating to 1,300 degrees C. with an exposure time $<\sim 8$ ms.

Eliminating Permanent Deformation and Defects

Very high doping concentration applications require a high surface temperature. In raising the substrate temperature to a high temperature particularly near the melting point, an issue involves permanent deformation of the substrate. In addition, analysis of silicon wafers following hot gas RTP have correlated the formation of "slip defects" resulting from permanent slip and breaking of crystal bonds with onset of permanent deformation.

High surface temperature without permanent deformation or crystal defects can be obtained by a hot gas RTP in the high heating power regime in accordance with the invention by establishing a large temperature difference across the wafer thickness, see FIG. 7. The bulk of the wafer, being at low temperature, then provides the structural rigidity to prevent permanent deformation.

Figure 12:
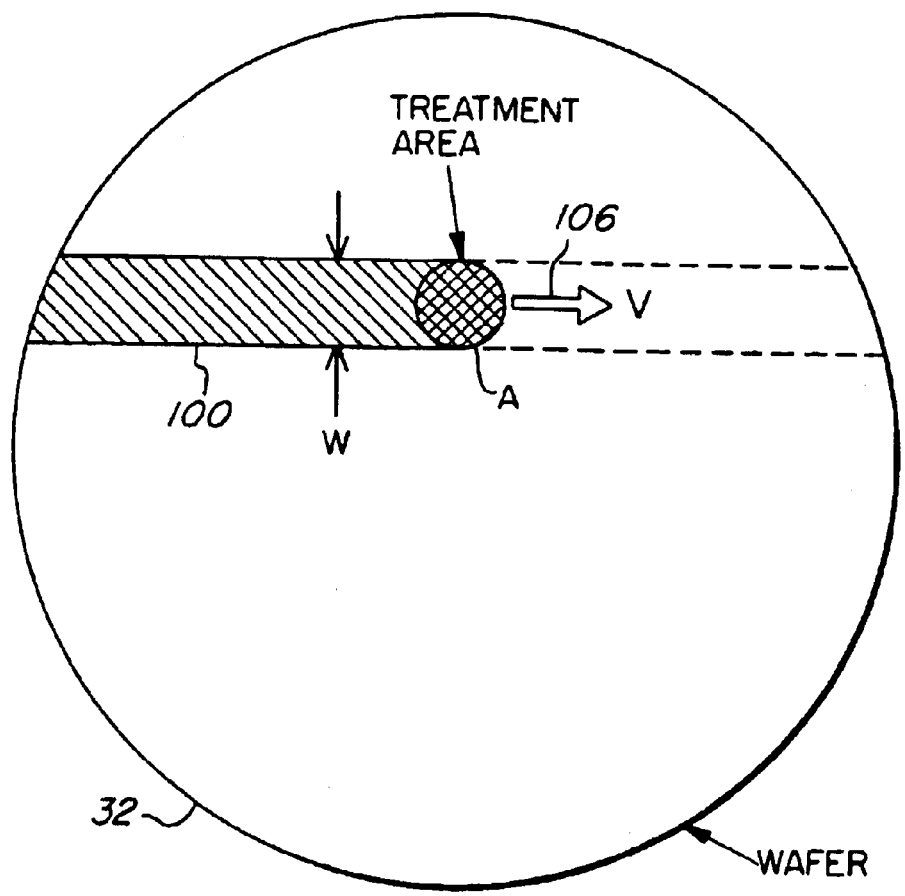
FIG. 12 is a schematic representation of a single linear pass of a hot gas treatment area across a circular substrate.

A method to Obtain Thermal Uniform Treatment of the Substrate a. Step and scan motion configuration for uniform treatment Very uniform thermal treatment is critical during silicon device manufacturing. A method to obtain uniform thermal treatment using a hot gas stream treatment area that is smaller than the substrate size is described with the following. FIG. 12 shows at 100 a single pass of the substrate 32 through the hot gas stream treatment area. The substrate 32 moves through the hot gas treatment area A at a velocity V to thermally treat the substrate in a linear path 100 having a characteristic width w.

Figure 13:
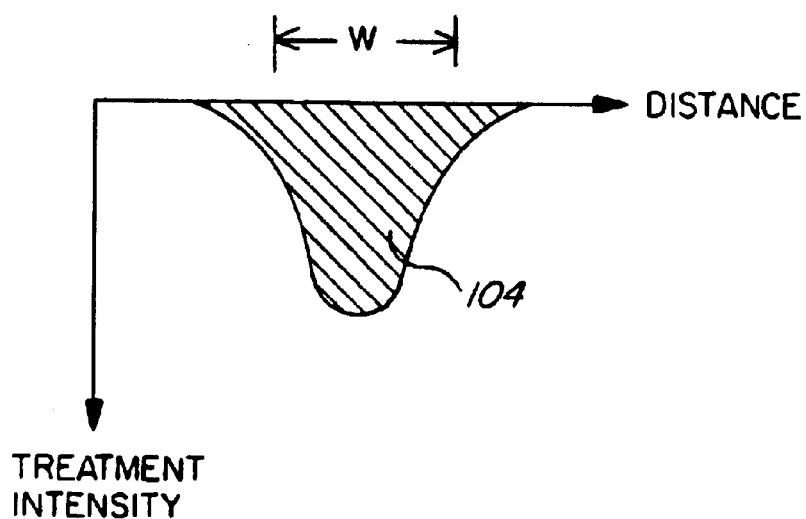
FIG. 13 is a diagram view of a thermal treatment profile, perpendicular to the scan direction, as would be obtained from a single linear pass of the substrate through a hot gas treatment area in accordance with the invention.

FIG. 13 shows plot 104 of a cross-section of the thermal treatment intensity (e.g., depth of diffusion of doping material; temperature) vs. distance for a cross-sectional area that is perpendicular to the scan direction 106 shown in FIG. 12.

Figure 14:
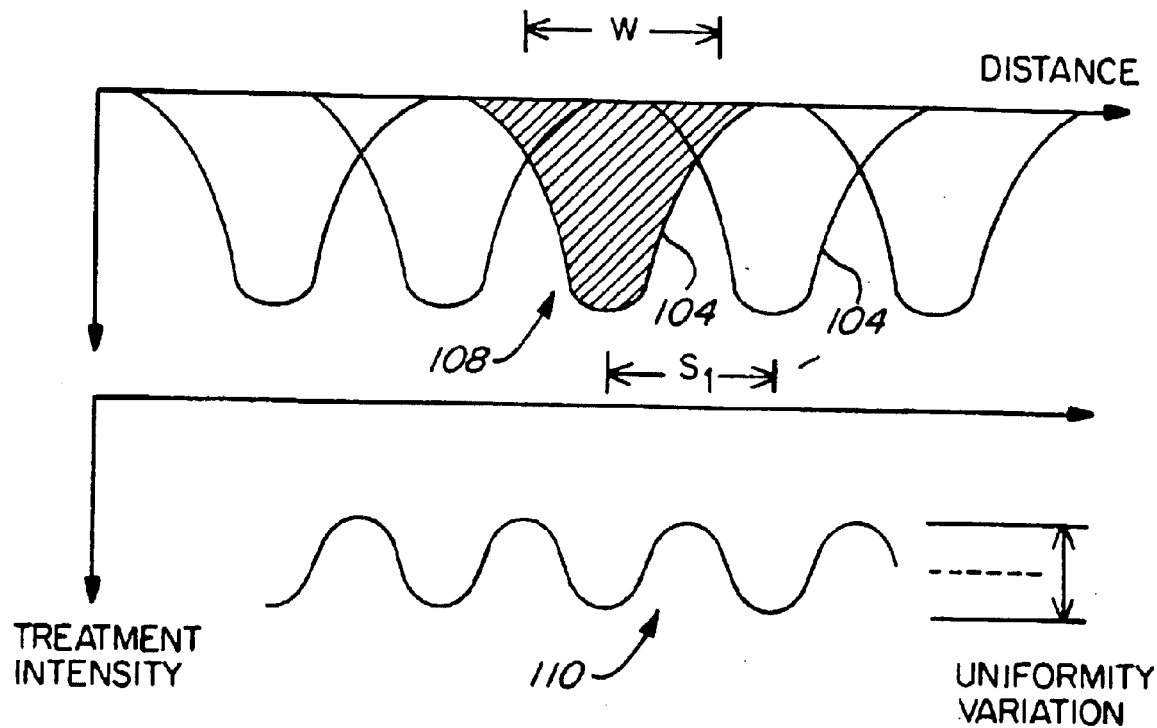
FIG. 14 is a diagram view of overlapped multiple linear scans where the overlap distance is comparable to the width of a single scan treatment profile.

FIG. 14 shows treatment of the full wafer 32 with multiple scans 104 across the wafer 32 where the step distance si between subsequent scans 104 is relatively large. In FIG. 14 the treatment intensity cross-section of the wafer 32 for each individual, overlapped scan with separation $s_1$ is shown at 108. In FIG. 14 the total treatment of the wafer 32 for a cross-sectional area perpendicular to the scan direction is shown at 110. At any point the total treatment resulting from the overlapped scans 104 is the superposition, or summation at that point, of the treatment intensities from each individual scan.

Figure 15:
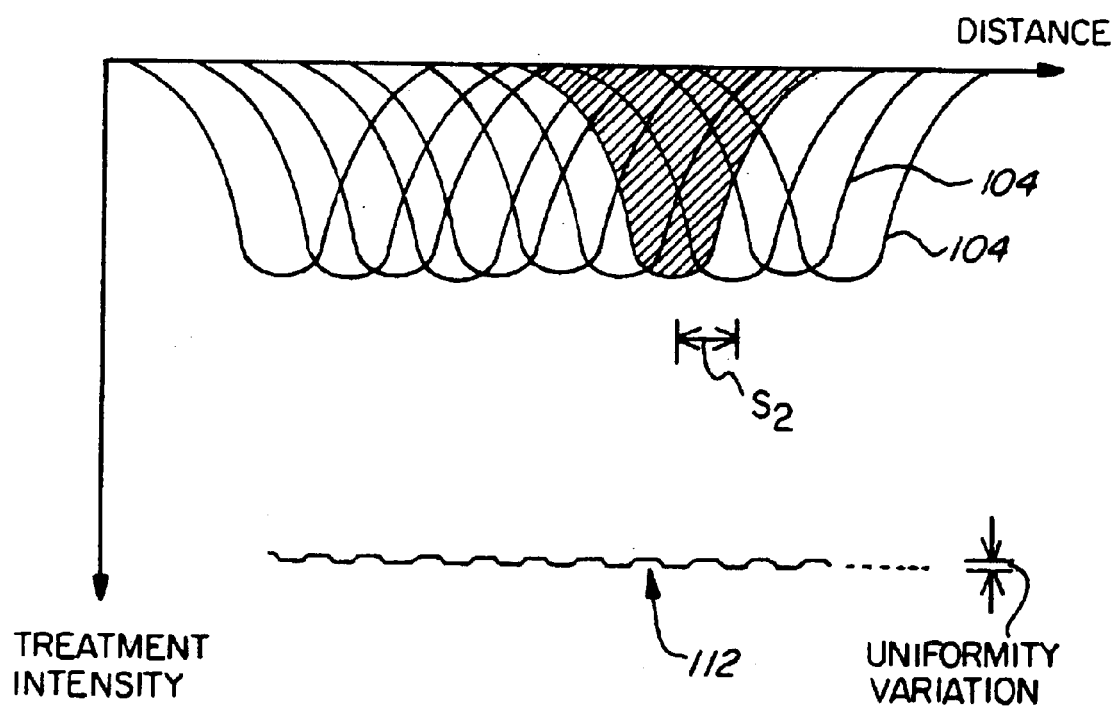
FIG. 15 is a diagram view of overlapped multiple linear scans where the overlap distance is small compared to the width of a single scan treatment profile.

FIG. 15 shows treatment of the full wafer by multiple scans across the substrate where the step distance $s_2$ between subsequent scans is small with respect to the width w of the treatment area A.

In the upper part of FIG. 15 the treatment intensity cross-section of the substrate for each individual, overlapped scan 104 with separation $s_2$ is shown. The cross-sectional area is perpendicular to the scan direction. In the lower part of FIG. 15 the total treatment of the substrate 32 is plotted, for a cross-sectional area perpendicular to the scan direction, with much lower, ripple-like treatment variation as illustrated at 112 for a ratio of $w/s_2$ of about 3 to 1. The step between scans may be reduced to make the uniformity variation less than any required value. For the hot gas treatment width A of about ~2 cm, very uniform treatment can be obtained with a step distance of about ~3 mm.

The ratio of $w/s_2$ can be as shown in FIG. 14 equal to 1, but preferably is in range from about 8 to 1 to about 3 to 1, with a ratio of about 6 to 1 being acceptable. Increasing the ratio increases the number of scans and may in the aggregate increase the effective impact of the process on the thermal budget to a higher level for the wafer as well increase the scanning time for the entire wafer 32. Too low a ratio w/s$_2$ results in too high a uniformity variation over the surface of the wafer 32.

b. Method to increase cooling time between scans

For precise control over the temperature reached by any point on the substrate 32 during exposure to the hot gas stream 36 it is necessary that the starting temperature of that point before exposure be constant. Consequently, for overlapped scans, before scanning over an area previously exposed to the gas stream the wafer temperature must have cooled back to the base, substrate holder temperature.

Figure 16:
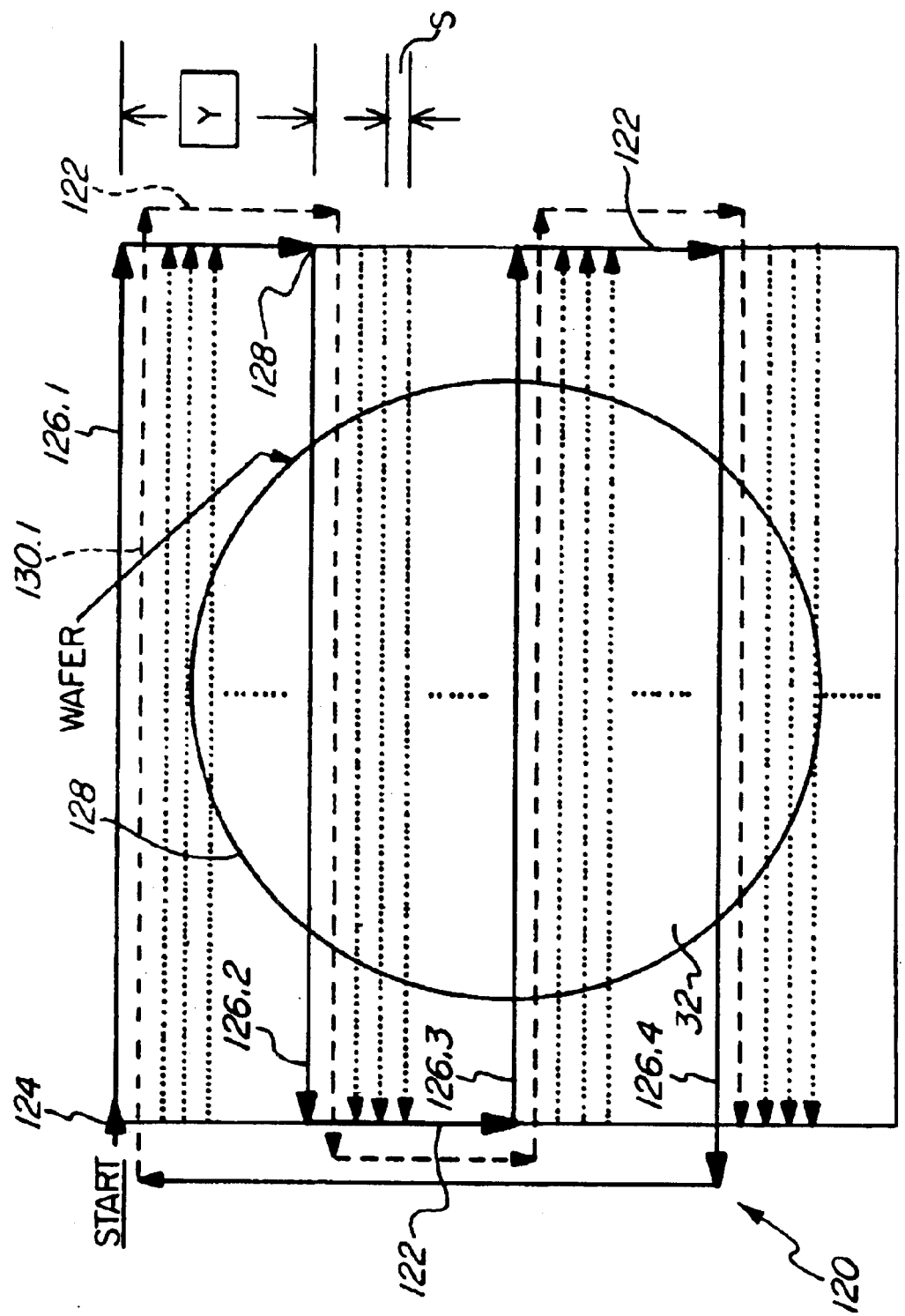
FIG. 16 is a schematic view of a step and scan motion configuration of the substrate through the hot gas stream to provide the overlapped multiple scans of FIGS. 14 and 15.

A method to provide increased cool-down time between overlapped scans is shown at 120 in FIG. 16. The time between overlapped scans is increased by scanning with large steps 122 between subsequent scans Y interlaced with small steps s. As shown in this Figure, the hot gas treatment area starts centered at the Start position 124 and scans across the substrate 32 at the programmed velocity that will give the required treatment temperature, see the top solid line 126.1. For the first scan, the edge of the hot gas treatment area A would cross the edge 128 of the substrate 32. Following the first scan 126.1, the substrate 32 is stepped a distance Y to the second scan position 126.2.

As shown in FIG. 16, four scans 126 are made with a step Y, solid scan lines. The second set of four scans, dashed lines, are made with an offset step s to the first scan step. Subsequent sets of scans 130 are made each with an offset step s to the previous scan set, dotted lines. Scan sets are repeated until the full wafer has been treated with scans offset by steps s. For uniform treatment of the full wafer the number of sets of scans, N, is:

$$N=(Y/s)-1 \qquad (18)$$

Using the scan pattern 120 shown in FIG. 16, the cool-down time between overlapped scans is increased by approximately a factor of four over a straight step and scan pattern. Using this concept the number of scans per set may be increased or decreased as needed to give full cool-down between overlapped scans. A necessary condition for the large step Y in a scan set is that Y be greater than the characteristic width of the hot gas treatment area w of FIG. 13.

For simplicity of illustration, FIG. 16 shows the substrate scans moving over a box area before stepping to the next scan position. To reduce processing time, the substrate 32 would only need to move fully out of the hot gas treatment area A before stepping to the next scan position. It is to be noted that this step and scan concept could also be implemented by having the substrate 32 scan through the hot gas treatment area by moving in an arcuate path instead of the linear paths shown in FIG. 16. The arcuate paths for each step would have a constant radius and be offset from each other in the manner as shown for the linear scans.

For the substrate holder geometry of prior art as shown in FIG. 3, the substrate holder 34 diameter is only slightly larger than the substrate diameter (e.g., ~1 mm). In practice, the hot gas treatment area A is not sharply defined, but rather, is smoothly spread out by the hydrodynamic gas flow over the wafer surface 46, see FIG. 17A. Consequently, as the hot gas treatment area A moves off the substrate 32, in the prior art design there is no processing of the wafer 32 from the outward flow from the hot gas treatment area. Consequently, there is relatively less treatment of the area close to the substrate edge relative to the area close to the substrate center. This effect may be partially compensated for in the programmed, motion of the substrate through the hot gas treatment area by slowing down the motion near the substrate edge.

Figure 17A:
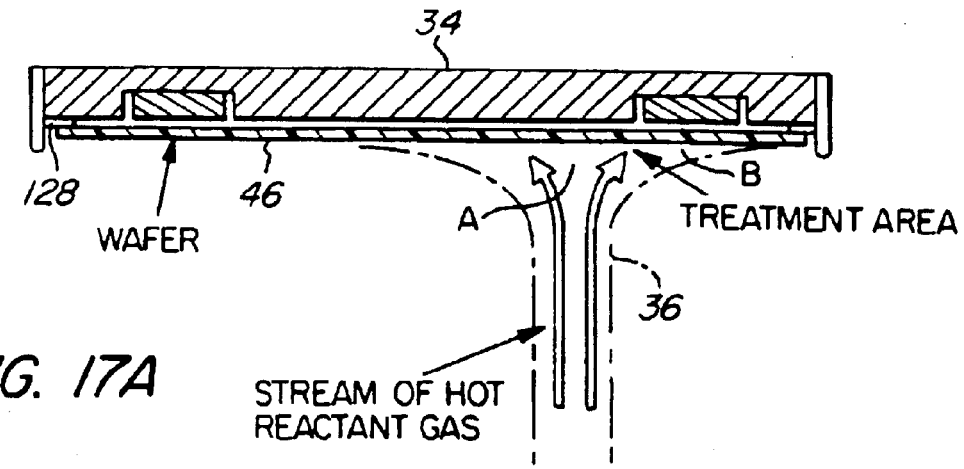
FIGS. 17A through 17C are schematic side views of a substrate holder and substrate.
Figure 17B:
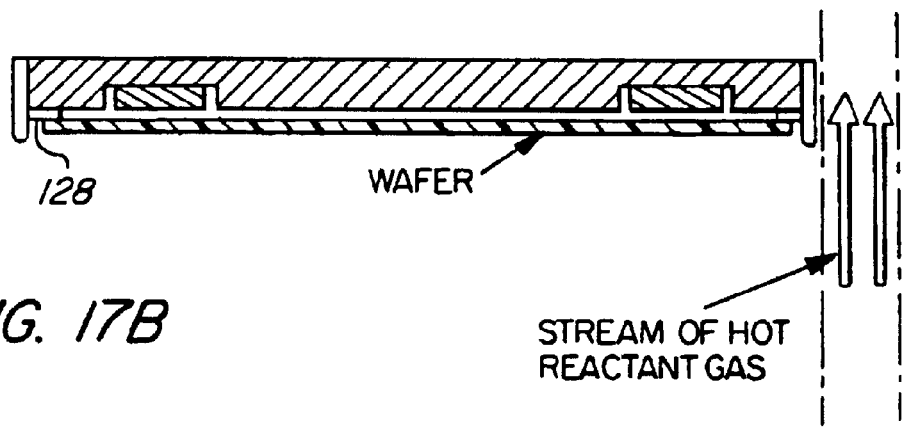

A preferred method to prevent this gas flow edge effect from adversely affecting the processing of the wafer 32 near the edge 128 as described in the previously referenced patent application No. 60/158,892. The edge of the substrate holder 34 is extended beyond the edge 128 of the substrate 32. With reference to FIG. 17A, when the primary treatment area A of the hot gas stream 36 is over the central portion of the substrate 32, the flow of gas out from A that can give a smaller, secondary treatment in the adjacent area B is symmetric with respect to A. As shown in FIG. 17B, when A is just off the edge 128 of the substrate 32 and holder 34 the outflow from the hot gas stream over the edge area of the substrate ceases.

Figure 17C:
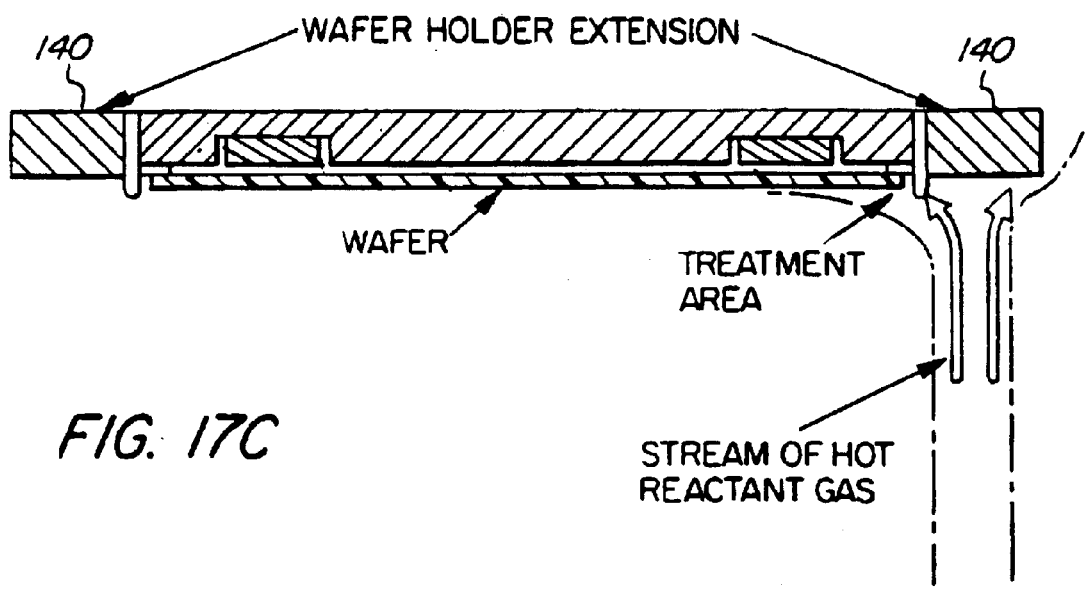

As shown in FIG. 17C, an annular substrate holder extension 140 can be added to the perimeter of the substrate holder 34 to effectively extend the a plane of the substrate 32 so that the peripheral area of the substrate will be exposed to the same secondary treatment area B as the main treatment area A moves off of the substrate 32. The flow of the process gas as the treatment area moves off the wafer edge will be similar to the flow pattern over the central area of the wafer. A key advantage is that the velocity of the substrate as it moves out of the treatment area can be maintained at a higher relative velocity with uniform treatment.

The substrate holder extension 140 should be at least half the width of the main treatment area A and preferably greater than the width of A. A typical dimension for A is 2 cm. A may be in the range of 0.5 cm to 5 cm. and need not be circular.

Improvements to the prior art non-contact vortex type substrate holder that provide advantages for this hot gas RTP invention are described in the U.S. Provisional Patent application No. 60/158,892, "Wafer holder for rotating and translating wafers for processing in an atmospheric plasma system with control of wafer holder temperature," inventors Bollinger and Tokmouline, filed Oct. 12, 1999 and continued in a United States Patent application filed Oct. 12, 2000.

Correction of Systematic Variation in the Wafer Treatment

Small systematic effects could arise to introduce small variations in the treatment across the substrate 32. Such variations can arise from a small variation in temperature across the wafer holder resulting in a corresponding small variation in the thermal processing. Such repeatable systematic effects may be measured and subsequently compensated for by programming the position dependent velocity of the substrate 32 through the hot gas stream. For example, a small measured thermal treatment deviation across the substrate $\delta T(x,y)$ from the required treatment $T_o$ can be corrected by a compensating velocity map V(x,y) for scanning the substrate through the hot gas stream. Small variations from $T_o$ are nearly linearly dependent on the treatment time and thus linear with $[V(x,y)]^{-1}$, a velocity map that compensates for the measured treatment variation is:

$$V(x,y)=V_o/[1+\delta T(x,y)/T_o] \qquad (14)$$

This velocity map may be corrected in an iterative procedure by measuring any thermal treatment variation and using this to re-calculate the velocity map. The iterated, compensation velocity map $V_{n+1}(x,y)$ is determined from the previous velocity map $V_n(x,y)$ for which a treatment variation $\delta T(x,y)$ was measured by:

$$V_{n+1}(x,y)=V_n(x,y)/[1+\delta T(x,y)/T_o] \qquad (15)$$

The velocity compensation may be applied from direct feedback from an in-situ, in-process wafer temperature measurement; or, from post-process measurement of the wafer characteristics such as a resistivity mapping of the substrate after RTP for diffusion or anneal.

Having thus described very fast Rapid Thermal Processing by use of a hot gas process and a means of using an atmospheric plasma for generating the required hot gas stream for the thermal processing, the various advantages and objects of the invention can be understood. Variations from the described process can be made by one skilled in the art without departing from the scope of the invention as set forth by the following claims.

What is claimed is:

1. A method for rapid thermal processing (RTP) of a substrate used to make semiconductor devices comprising the steps of:

forming a hot gas stream whose temperature is substantially above a peak substrate surface temperature obtained during thermal processing of the substrate by the hot gas stream and whose power density is sufficiently high to increase the surface temperature of the substrate at a rate in excess of about $10^{3°}$ C./sec; and effectively moving a substrate through the hot gas stream at a speed selected to treat an area of the surface of the substrate at a high peak temperature while establishing a temperature differential throughout the thickness of the substrate to enable the substrate to produce enhanced cooling of a treated area of the substrate by thermal conduction into the bulk of the substrate and enable the substrate to cool the treated area at a rate of at least about $10^{3°}$ C./sec after the treated area has passed out of the hot gas stream.

2. The method as claimed in claim 1 wherein the power density of the hot gas stream is above about $5 \times 10^7$ W/m².

3. The method as claimed in claim 1 wherein the exposure time $t_E$ of said treated area of the substrate to the hot gas stream is less than 10 ms and determined by a value given by an expression wherein $t_E$ is dependent upon the substrate density, $\rho$, substrate heat capacity, $c_p$, substrate thickness, $\Delta h$, and substrate thermal conductivity, k.

4. The method as claimed in claim 1 wherein the velocity of the substrate relative to the hot gas stream is above about 1.0 m/sec.

5. The method as claimed in claim 1 for a silicon substrate wherein the velocity of the substrate is selected sufficiently high to yield an exposure time of any treated area on the substrate to the hot gas stream of less than about 8 ms.

6. The method as claimed in claim 2 wherein the velocity of the substrate is above about 1.5 m/sec.

7. The method as claimed in claim 1 wherein said substrate is held in a substrate holder; of the non-contact vortex type and wherein said substrate holder has an extension beyond the substrate edge, said extension extending out from the substrate for a distance greater than the characteristic width of the hot gas stream treatment area.

8. The method as claimed in claim 1 and further including the step of doping of the semiconductor substrate by annealing of the crystal damage from a previous implantation of doping atoms.

9. The method as claimed in claim 1 and further including the step of diffusing doping atoms from a layer deposited over the substrate.

10. The method as claimed in claim 1 and further including the step of diffusing doping atoms from the hot gas stream wherein a material containing the doping atoms was injected into the hot gas stream.

11. A method for rapid thermal processing (RTP) of a substrate used to make semiconductor devices comprising the steps of:

forming an atmospheric arc-type hot plasma stream whose power density is above about $5 \times 10^7$ W/m² and has a cross-sectional area that is substantially less than the surface area of the substrate to be treated by the hot gas stream; and moving a substrate through the hot gas stream with a predetermined controlled pattern and at a speed that is above a threshold level selected to treat a surface of the substrate at a high temperature while preserving a temperature differential throughout the thickness of the substrate to significantly contribute to a cooling of a treated area of the substrate after the treated area has passed out of the hot atmospheric gas stream.

12. The method as claimed in claim 11 wherein said threshold level is at about 1.5 m/sec.

13. A method for rapid thermal processing (RTP) of a substrate used to make semiconductor devices comprising the steps of:

forming a hot gas stream whose power density is sufficiently high to increase the surface temperature of the substrate at a rate in excess of about $10^{3°}$ C./sec; and moving a substrate through the hot gas stream at a speed selected to treat the surface of the substrate at said high temperature while preserving a temperature differential throughout the thickness of the substrate and enable the substrate to cool the treated area at a rate of at least about $10^{3°}$ C./sec after the treated area has passed out of the hot gas stream.

14. The method as claimed in claim 13 wherein said hot gas stream has a power density that is sufficiently high to raise the temperature of the surface of the substrate to above about 1000° C. during movement of the substrate relative to said hot gas stream without permanent deformation of the substrate and without introducing crystal defects into the substrate.

15. The method a claimed in claim 14 wherein the power density of the gas stream is above about $5 \times 10^7$ W/m².

16. The method as claimed in claim 13 wherein said hot gas stream has a power density that is sufficiently high to raise the temperature of the surface of said substrate along a path to a level at which a shallow segment of the substrate melts along said path.

17. The method of claim 13 wherein the motion of said substrate is controlled so as regulate the peak temperature of the surface of the substrate.

18. The method of claim 1 wherein said movement of the substrate is controlled to provide multiple overlapping passes with sufficient intervals between adjacent passes to enable a portion of the substrate exposed to the hot gas stream during a previous pass to cool to a desired level for a generally uniform thermal treatment of the entire substrate while establishing said temperature differential.

19. The method as claimed in claim 1 wherein said substrate has a motion configuration wherein the substrate moves through the hot gas stream with a step and scan motion such that the substrate moves with sequential, off-set passes through the hot gas stream with a controlled velocity along linear paths.

20. The method as claimed in claim 1 wherein said substrate has a motion configuration wherein the substrate moves through the hot gas stream with a step and scan motion such that the substrate moves with sequential, off-set passes through the hot gas stream with a controlled velocity along paths that are arcuate.

21. The method as claimed in claim 13 wherein the motion of the substrate is along overlapping scans while providing a cool-down time between scans with scans which are off-set from each other where:

scans in each set are greater in dimension than the characteristic width of the hot gas treatment area;

subsequent sets of scans are offset by sufficiently small steps to give uniform treatment and sets of scans are run to fully treat the entire substrate.

22. A substrate etching method for removing a polymer from a substrate having high depth to width aspect ratio holes, comprising the steps of:

directing an atmospheric plasma hot gas having a heat flux in the range from $10^6$ to $10^7$ W/m$^2$ for a controlled rapid removal of a polymer from a high depth to width ratio hole in the substrate and varying the exposure time of the substrate to the hot gas to obtain a uniform net removal of polymer material from high depth to width aspect ratio holes in the substrate.

* * * * *